United States Patent [19]
Mohan

[11] Patent Number: 6,069,511
[45] Date of Patent: May 30, 2000

[54] DIGITAL SLEW RATE AND DUTY CYCLE CONTROL CIRCUIT AND METHOD

[75] Inventor: Jitendra Mohan, Palo Alto, Calif.

[73] Assignee: National Semiconductor Corporation, Santa Clara, Calif.

[21] Appl. No.: 09/140,091

[22] Filed: Aug. 26, 1998

[51] Int. Cl.[7] .............................. H03K 3/017; H03K 5/04; H03K 7/08
[52] U.S. Cl. ............................................. 327/171; 327/170
[58] Field of Search ..................................... 327/170, 175, 327/176, 178, 108, 104, 112, 171

[56] References Cited

U.S. PATENT DOCUMENTS

| | | | |
|---|---|---|---|
| 3,931,588 | 1/1976 | Gehweiler | 331/57 |
| 5,483,188 | 1/1996 | Frodsham | 327/170 |
| 5,568,081 | 10/1996 | Lui et al. | 327/380 |
| 5,838,186 | 11/1998 | Inoue et al. | 327/389 |
| 5,859,552 | 1/1999 | Do et al. | 327/170 |
| 5,917,762 | 6/1999 | Zheng et al. | 365/194 |

*Primary Examiner*—Toan Tran
*Assistant Examiner*—Quan Tra
*Attorney, Agent, or Firm*—Limbach & Limbach L.L.P.

[57] ABSTRACT

A signal shaping circuit for use in a transmission line driver and the like is disclosed. The input is pulse signal having a rising edge that triggers a delay circuit which produces a first sequence of multiple delayed outputs and a falling edge which triggers the delay circuit to produce a second sequence of multiple delayed outputs. Transition control circuitry is included which operates to control the transition time of the output signal in a first direction, such as the rise time, in response to the first sequence of multiple delayed outputs and to control the transition time of the output signal in a second direction, such as the fall time, in response to the second sequence of multiple delayed outputs. By controlling the first and second delayed output, the rise and fall times of the output signal can be precisely controlled.

44 Claims, 12 Drawing Sheets

DIGITAL SLEW RATE AND DUTY CYCLE CONTROL CIRCUIT AND METHOD

BACKGROUND OF THE INVENTION

The present invention relates generally to digital control circuitry and, in particular, to circuitry for controlling the slew rate of signals using digital techniques.

DESCRIPTION OF RELATED ART

In many high speed circuits, there is a requirement to control the slew rates of signals, the rate at which the signal changes in volts/second, for various reasons including the minimization of electromagnetic interference. For signals of a given magnitude, slew rate values can be converted to rise and fall transition times. The need to control slew rates is particularly true in high speed interface circuits. By way of example, one interface specification for the LAN TP-PMD (100 BASE T), uses an encoding scheme referred to as the Multi Level Transition-3 (MLT-3) which provides a three level signal which is transmitted over a Category 5 twisted pair cable. Referring now to the drawings, FIG. 1 shows the driver output interface which includes a transformer 10 having a winding ratio of one to one. A pair of 100 Ω termination resistors 12 and 14 are connected across the primary and secondary windings, respectively. A voltage is developed at the output Vout across the secondary winding having three levels, including a positive voltage V$^+$ of +1 volt, V$^-$ of −1 volt and an intermediate level V$^0$ of 0 volts, as shown in FIG. 2C. The driver circuit (not depicted) which produces the three level output of FIG. 2C is driven by signals Vin1 and Vin2. Signals Vin1 and Vin2 are normally in a high state and go low only when active. Further, signals Vin1 and Vin2 are not permitted to go active or low at the same time. It is also necessary to control the duty cycle of the Vout. The duration of the positive and negative pulses of Vout (measured at the 50% point) and the duration intermediate the pulses are ideally of equal value. For a 62.5 Megabit data rate, the durations should be 16 nanoseconds each, within ±500 picoseconds.

In a typical application, the data rate over the twisted pair is 125 Megabit. Further, the MLT-3 specification requires that the rise and fall transition times of the output signal be symmetrical to within 500 picoseconds (500×10$^{-12}$ seconds). Previous attempts to comply with such demanding specifications have met with limited success in that the circuitry used is dependent upon process, voltage and temperature.

There is a need to tightly control the rise and fall transition times of signals regardless of variations in process, voltage and temperature. Control circuitry in accordance with the present invention overcomes the above-described shortcomings of the prior art. Rise and fall transition times can be accurately and independently controlled notwithstanding process, temperature and voltage variations. Further, the duty cycles of signals can be accurately controlled. These and other advantages of the present invention will become apparent to those skilled in the art upon a reading of the following Detailed Description of the Invention together with the drawings.

SUMMARY OF THE INVENTION

A signal shaping circuit for use in a driver circuit and the like is disclosed which produces an output signal having independently controllable rise and fall time, sometimes referred to as rise and fall transition times, from an input pulse signal. In a typical application, a driver circuit receives an input signal in the form of a first negative-going input pulse signal on one input and a second negative-going input pulse signal on a second input, separated in time from the first input pulse signal. The output of the driver circuit is a composite of a first output signal of one polarity and a second output signal of an opposite polarity.

The subject signal shaping circuit includes a delay circuit configured to produce a first sequence of multiple delayed outputs in response to a transition of the input pulse signal in one direction and a second sequence of multiple delayed outputs in response to a transition of the input pulse signal in an opposite direction. In the exemplary driver circuit, the delay circuit includes ten delay stages, with each delay stage producing one of the first sequence multiple delayed outputs when the input signal has a transition in one direction and producing one of the second sequence multiple delayed outputs when the input signal has a transition in the opposite direction.

The signal shaping circuit further includes transition control circuitry which operates to control the transition time of the output signal in one direction, such as the rise transition time, in response to the first sequence of multiple delayed outputs. The transition control circuitry further operates to control the transition time of the output signal in an opposite direction, such as the fall transition time, in response to the second sequence of multiple delayed outputs. In the driver circuit embodiment, the transition control circuitry includes ten current sources which are sequentially connected to an output impedance in response to the first sequence of multiple delayed outputs so as to create a controlled rise transition time in the output signal. The current sources are sequentially disconnected from the output impedance in response to the second sequence of multiple delayed outputs so as to create a controlled fall transition time in the output signal.

DETAILED DESCRIPTION OF THE INVENTION

Figure 1:
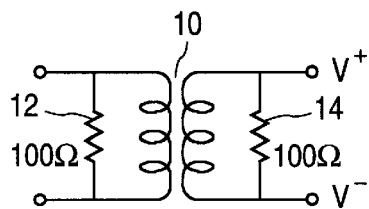
FIG. 1 depicts a coupling transformer and associated load resistances of the type used in the high frequency transmission of data on a twisted pair line.
Figure 2A:
FIGS. 2A–2C are timing diagrams that illustrate a conventional three level encoding scheme used for transmission of data over a twisted pair line.
Figure 2B:
Figure 2C:
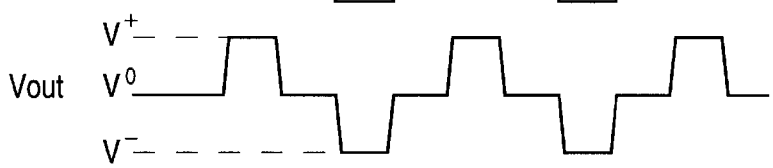
Figure 3:
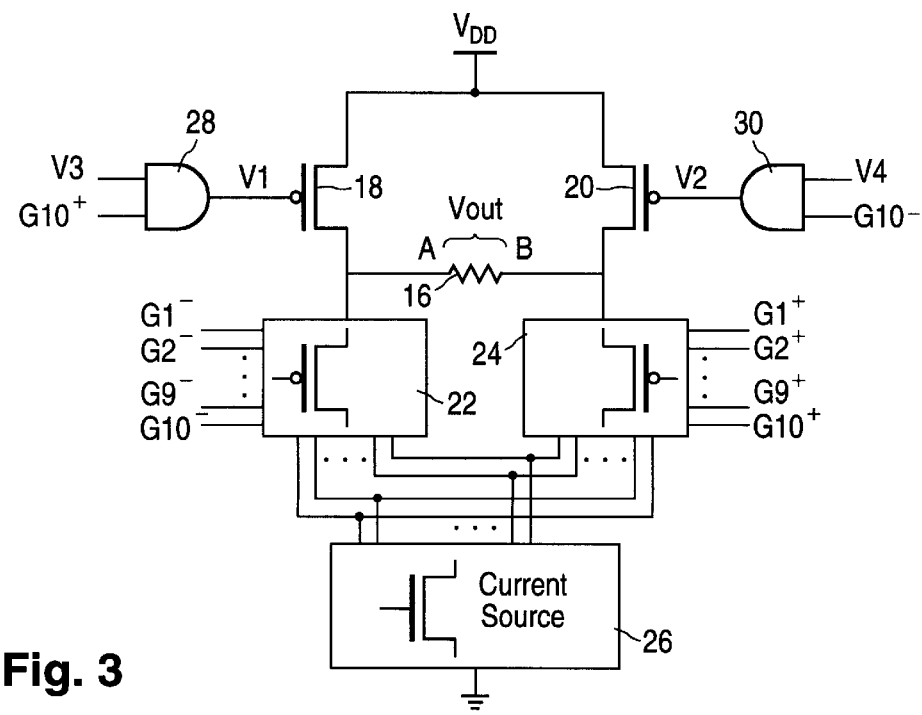
FIG. 3 is a schematic diagram of a portion of a driver circuit utilizing slew rate control circuitry in accordance with the present invention.

The signal shaping circuit and method in accordance with the present invention will be described in the context of a driver circuit. However, it is to be understood that the subject invention is in no way limited to this particular application. Referring again to the drawings, FIG. 3 is a schematic diagram of a portion of a driver circuit which implements the MLT-3 encoding scheme. A 50 Ω resistor 16 represents the equivalent impedance at the primary winding of output transformer 10 (FIG. 1) including the 100 Ω resistors 12 and 14 effectively connected in parallel by the transformer. As will be explained in greater detail, the driver circuit operates so as to control the direction and magnitude of the current flow through equivalent resistor 16 in response to inputs Vin1 and Vin2 so as to produce the MLT-3 signal across the resistor having well controlled rise and fall transition times and a well controlled duty cycle.

The FIG. 3 driver circuit includes a pair of P-type upper transistors 18 and 20 having their sources connected to a common positive supply voltage $V_{DD}$. $V_{DD}$ is typically +5 volts. The drains of transistors 18 and 20 are each connected to respective P-type split channel transistor arrays 22 and 24. Each of the transistor arrays 22 and 24 includes a total of ten P-type transistors having a common source connection and separate drain and gate connections. The gates of the transistors of array 22 are connected to receive respective signals G1⁻ through G10⁻, with the gates of transistor array 24 being connected to receive respective signals G1⁺ through G10⁺.

The drains of the ten P-type transistors of array 22 are connected to a current source circuit 26 which includes a total of ten separate current sources of equal magnitude. Each drain of array 22 is connected to a separate current source output of circuit 26. Similarly, the drains of the ten P-type transistors of array 24 are separately connected to the same ten current source outputs of the current source circuit 26.

The output resistor 16, across which output Vout is produced, is connected between the drains of transistors 18 and 20. The state of transistors 18 and 20 is controlled by AND gates 28 and 30, respectively. As will be explained in greater detail, gate 28 causes transistor 18 to be conductive when Vout is to be positive and gate 30 causes transistor 20 to be conductive when Vout is to be negative.

Figure 4:
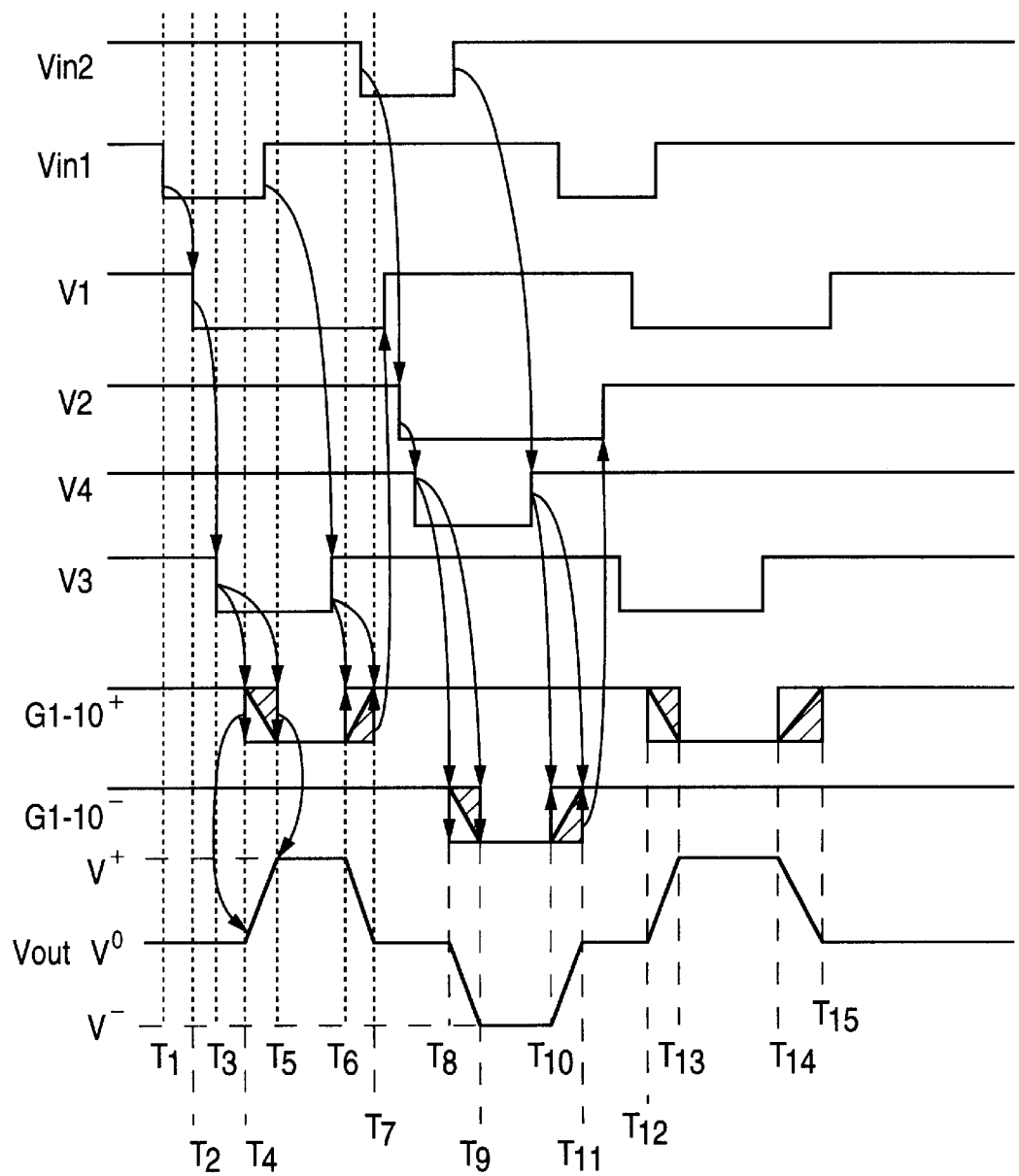
FIG. 4 is a timing diagram illustrating the operation of the FIG. 3 circuit.

A simplified overview of the operation of the FIG. 3 portion of the subject invention will now be given. FIG. 4 is a timing diagram, not to scale, showing the state of the primary signals of an exemplary embodiment of the subject invention. As previously noted, signals Vin1 and Vin2 are the two inputs of the driver circuit, with signal Vout being the output produced across resistor 16. Prior to time T1, both upper P-type transistors 18 and 20 are off as are all of the transistors in the transistor arrays 22 and 24. Thus, there is no current flow though the equivalent resistor 16 so that output Vout is at $V^0$ (0 volts).

In general terms, current flow through load resistor 16 will be increased in one direction in 2 milliamperes steps until the total current is 20 milliamperes. This creates the positive voltage V⁺ swing in Vout across resistor 16 of +1 volt. The current will then be decreased in 2 milliampere steps until Vout is back at 0 volts. Then current flow through resistor 16 will be increased in the opposite direction in 2 milliampere steps until the total current is 20 milliamperes. This creates the negative voltage V⁻ swing in Vout of −1 volt. The current will then be decreased in ten 2 milliampere steps until Vout returns to 0 volts.

Referring back to the FIG. 4 timing diagram, at time T1 signal Vin1 goes active (low), with signal Vin2 always remaining inactive when Vin1 is active, as previously noted. A second signal V3 is derived from signal Vin1 by way of duty cycle compensation circuitry, to be explained later. Signals V3 and G10+, which are both active low, are combined in AND gate 28. Thus, whenever V3 or G10+ are active (low), the output of gate 28 is low thereby turning on transistor 18. AND gate 30 combines a signal V4 derived from Vin2 and G10− and performs a similar function in controlling the state of transistor 20. When signal V1 goes active at time T2, upper P-type transistor 18 is turned on thereby causing terminal A of resistor 16 to be at a voltage approaching that of supply $V_{DD}$. Note that signal V2, derived from input Vin2, will remain inactive. Delay signals G1+ through G10+ are also derived from inputs signals Vin1 and V3 using programmable delay circuitry to be described. G1+ will go active (low) at time T4, that being a relatively short delay after V1 goes active. G2+ will go active a somewhat greater delay after V1 goes active, with signal G3+ through G10+ similarly going active after successively longer individual delays. The total delay, from T4 to T5, is set equal to the desired rise transition time of signal Vout as the signal goes from $V^0$ to $V^+$. Assuming, by way of example, that the total rise time is to be 2 nanoseconds, the additional delay provided by each of the ten signals G1+ to G10+ would be 200 picoseconds. Thus, G2+ would go active after a delay of 200 picoseconds, G2+ would go active after a delay of 400 picoseconds continuing until G10+ goes active after a delay of 2000 picoseconds (2 nanoseconds).

When G1+ goes active at time T4, the associated P-type transistor in array 24 will turn on and connect terminal B of load resistor 16 to one of the ten current source outputs of the current source circuit 26. In a typical application, each current source draws 2 milliamperes. Thus, at time T4, when G1+ goes active thereby connecting one current source output of the current source circuit 26 to terminal B of load resistor 16, 2 milliamperes of current will begin to flow through the resistor thereby causing the voltage drop across the resistor, Vout, to increase from 0 volts to 100 millivolts. About 200 picoseconds later, G2+ goes active thereby turning on a second transistor of array 24 so as to connect a second 2 milliampere current source output to resistor 16. Since G1+ will remain active, the total current through resistor 16 will increase to four milliamperes so that Vout will increase from 100 millivolts to 200 millivolts. The sequence will continue until time T5 when all ten of the transistors of array 24 are turned on and the total current flow through resistor 16 is 20 milliamperes. At that time, the drop across resistor 16, Vout, will be +1 volt.

Eventually, input Vin1 will go inactive thereby causing V3 to become inactive. This will cause signal G1+ to become inactive at time T6. Note that the delay introduced by signals G1+ through G10+ going from inactive to active and going from active to inactive can be made the same or can be made different. Once G1+ goes inactive, the total current flow through resistor 16 will drop by 2 milliamperes so that Vout will begin to drop. Eventually, at time T7, all signals G1+ through G10+ will be inactive so that Vout will be at 0 volts. When G10+ goes inactive, V1 will go high thereby turning off upper P-type transistor 18.

A similar sequence takes place when input Vin2 goes active between times T6 and T7. As will be explained later, this will eventually cause signal V2 to go active (low) thereby turning on upper P-type transistor 20. This will result in a further signal V4 to go inactive, as will be explained, which will, in turn, cause signal G1− to go low at time T8. This will cause one of the ten transistors in array 22 to turn on thereby connected terminal A of load resistor 16 to one of the 2 milliampere current source outputs of current source circuit 26. Thus, signal Vout will go negative by 100 millivolts. The sequence will continue unit, at time T9, all ten current source outputs will be connected so that Vout will be at −1 volt.

All ten transistors of array 22 will remain on until time T10 when G1+ goes inactive. This will cause Vout to change from −1 volt to −0.9 volts. Eventually, at time T11, G1− through G10− will be inactive thereby resulting in no current flow through resistor 16 so that Vout will again be at 0 volts. Note that the delays of signals G1− through G10− going from active to inactive and the delays going from inactive to active can be independently controlled. Thus, the rise transition time from T8 to T9 and the fall transition time from T10 to T11 can also be independently controlled.

When inputs Vin1 and Vin2 are encoded by the subject driver circuit, there is a tendency for the driver circuit to distort the duty cycle of the inputs. This is particularly true when different rise and fall transition times are selected. In the present example, the duty cycle relates to the amount of time inputs Vin1 and Vin2 are active and the intermediate time period, all three of which are ideally the same duration. Since, as previously noted, there is a specification relating to duty cycle, circuitry is provided that functions to predistort the duty cycle so that so that subsequent distortion of the duty cycle will result in an output Vout having the proper duty cycle.

Figure 5:
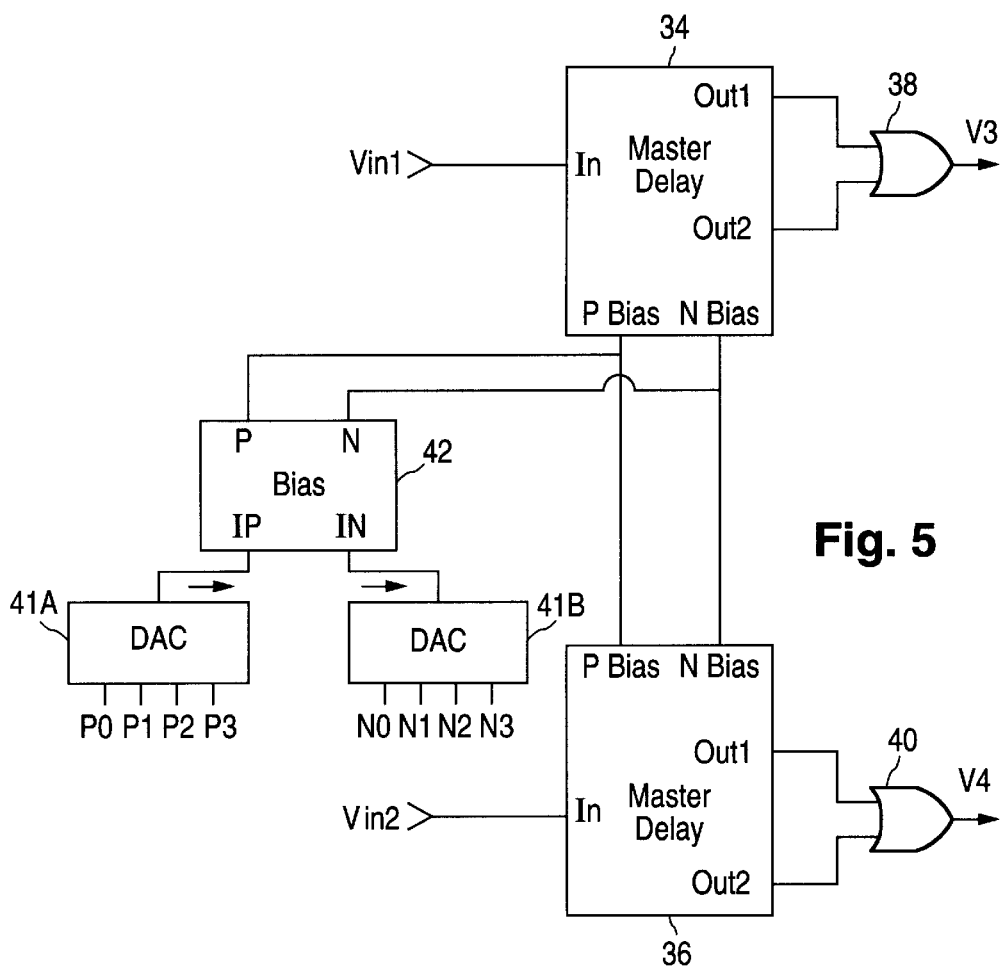
FIG. 5 is a block diagram of a duty cycle compensation circuit as used in the driver circuit embodiment of the present invention.
Figure 6:
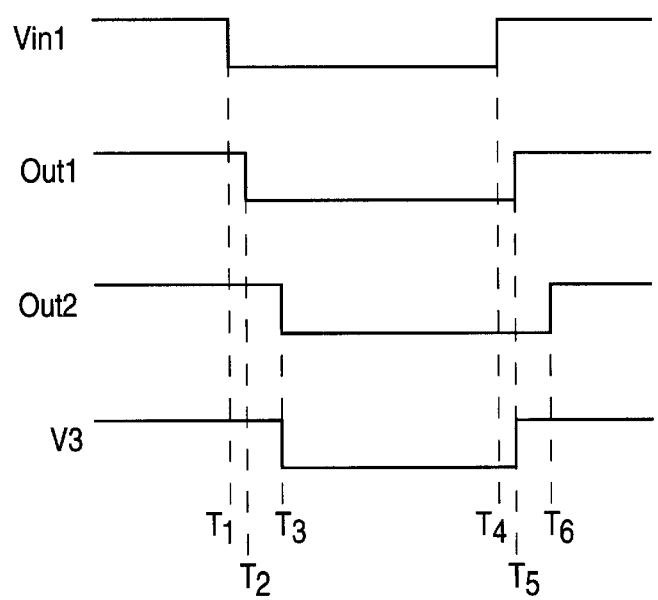
FIG. 6 is a timing diagram illustrating the operation of the FIG. 5 compensation circuit.

FIG. 5 is a block diagram of the duty cycle compensation circuitry used to predistort the duty cycle of inputs Vin1 and Vin2 so as to produce outputs V3 and V4, respectively. FIG. 6 is a timing diagram showing the manner in which output V3 is produced for input Vin1, with output V4 being produced from Vin2 in the same manner. Input Vin1 is applied to the input of a Master Delay circuit 34. A similar delay circuit 36 receives input Vin2. The delay circuits 34 and 36 each produce a pair of delayed outputs Out1 and Out2. These delayed outputs are combined by an OR gate 38 and 40, respectively, so as to produce outputs V3 and V4.

Figure 7:
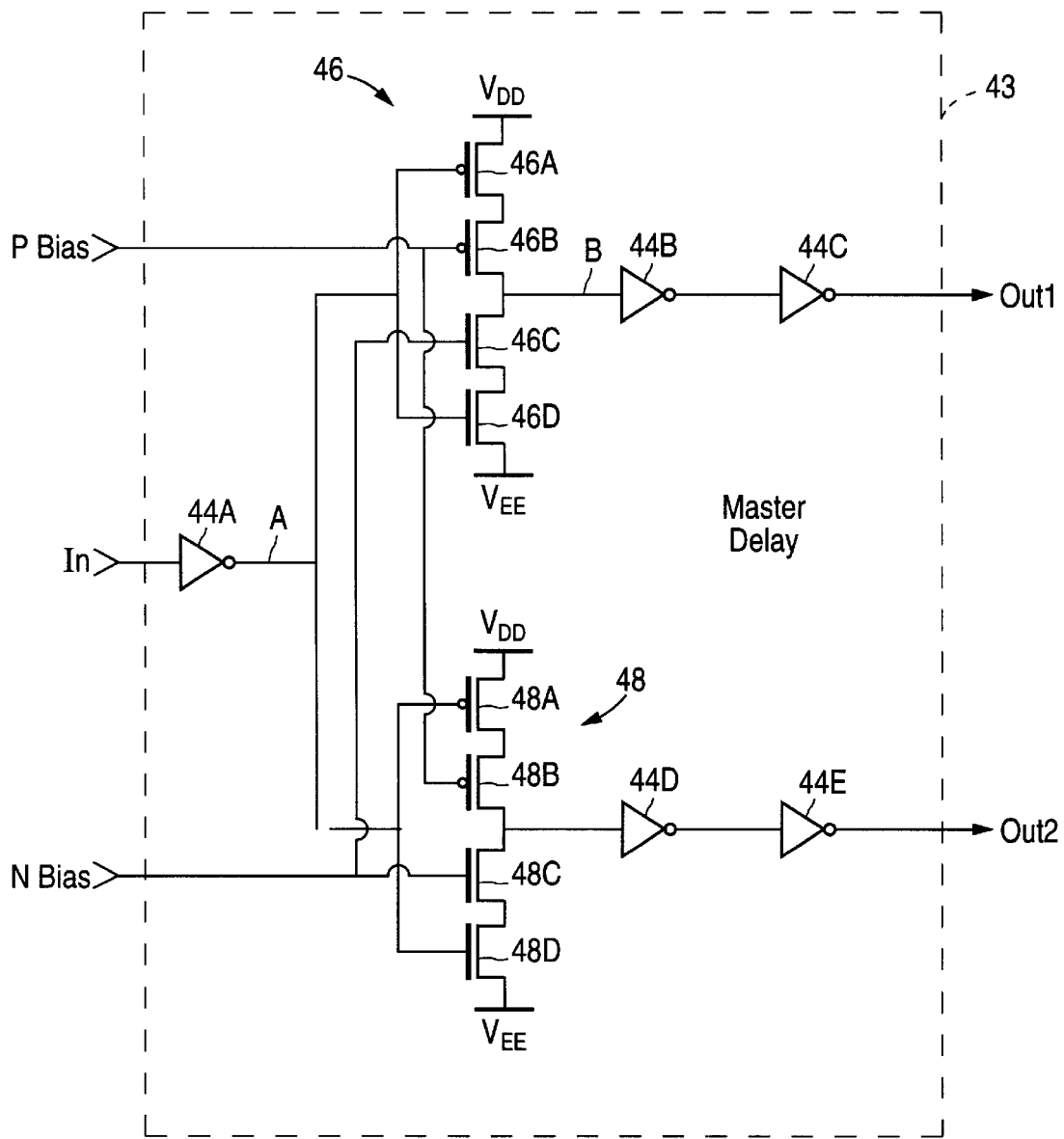
FIG. 7 is a block diagram of the Master Delay circuit used in the driver circuit embodiment of the present invention.

FIG. 7 is a detailed schematic diagram of a Master Delay circuit 43 which can be used as the delay circuits 34 and 36 of the FIG. 5 duty cycle compensation circuit. The same circuit is also used to generate the delay signals G1+ through G10+ and delay signals G1− through G10 −, as will be explained. The input to Master Delay circuit 43 is connected to a inverter 44A, the output of which is connected to separate delay paths, including one having an upper delay stage 46 and one having a lower delay stage 48. Although the absolute delay provided by the delay paths is relatively stable with changes in process, temperature, voltage and the like, the difference in delay provided by the two paths is even more stable since such changes tend to affect the two paths in the same manner.

The upper delay stage 46 includes two P-type transistors and two N-type transistors, all of which are connected in series. The gates of transistors 46A and 46D are connected together to form the delay stage 46 input, with the drains of transistors 46B and 46C being connected together to form the delay stage output. The gate of transistor 46B is connected to a bias voltage P Bias which causes transistor 46B to function as a current source when the delay stage 46 output is changing from a low state to a high state. Similarly, the gate of transistor 46C is connected to a bias voltage N Bias which results in N-type transistor 46C acting as a current source when the delay stage output is changing from a high state to a low state.

Delay stage 46 is a current restricted inverter stage, with the gain of the stage being reduced because of the limited current available to charge and discharge the internal capacitances of the stage when the stage is changing states. The magnitude of the current provided by current source transistor 46B controls the gain of the delay stage 46 when the stage output is changing from a low to high state. The transistor 46C current source controls the gain of the delay stage when the stage output is changing from a high to a low state. The size (W/L) of transistors 46B and 46C and the level of the bias voltages P Bias and N Bias are used to control the current source magnitudes.

Figure 8:
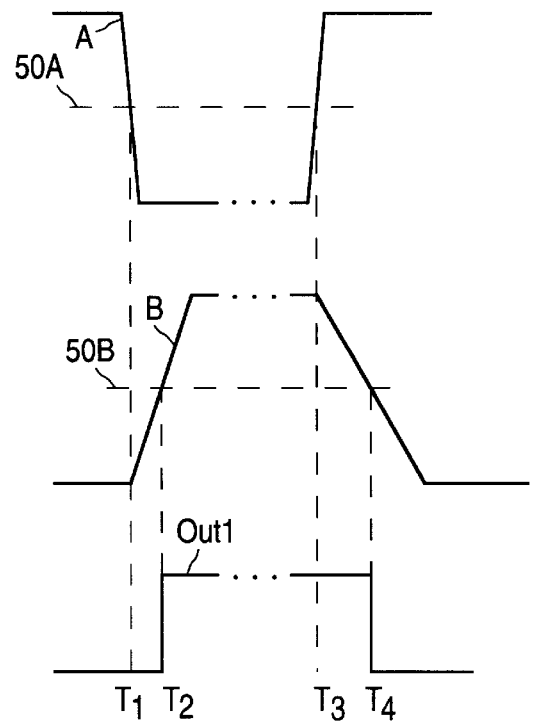
FIG. 8 is a timing diagram illustrating the operation of one of the delay stages of the Master Delay circuit of FIG. 7.

FIG. 8 is a timing diagram, not to scale, illustrating the operation of the upper delay stage 46 of FIG. 7. Waveform A represents an exemplary input signal at node A of FIG. 7 and is generated by inverter 44A. At a time just prior to T1, the input to inverter 44A changes from a low to a high state (not depicted). As indicated by waveform A of FIG. 8, the output of inverter 44A changes from a high to a low state with a relatively fast fall time because the input to the inverter has a fast rise time and because inverter 44A exhibits high gain when the inverter input is near the inverter threshold voltage.

When the input to the delay stage 46, waveform A, approaches the threshold voltage 50A of the delay stage, transistor 46D starts to turn off and transistor 46A starts to turn on. Transistor 46C begins functioning as a current source, with the output of the current source operating to change the charge on various internal capacitances of the stage. Since the rate of change in voltage across a capacitor is proportional to the magnitude of the charging current, it can be seen that time required for the delay stage to change state is approximately inversely proportional to the magnitude of the available current.

At time T1, the threshold voltage of the delay stage 46 is approached so that the delay stage output at node B begins to change from a low state to a high state. The rise time of the output is largely due to the reduced gain of the delay stage caused by current source transistor 46C, as previously described. At time T2, the threshold voltage of inverter 44B is reached followed very quickly by inverter 44C. Thus, at time T2, the output of inverter 44C, signal Out1, will rapidly switch from a low to a high state.

At time T3, node A changes state thereby causing the delay stage 46 to being changing state at about the same time. The fall time of the delay stage is large due to the presence of current source transistor 46B which restricts the available current. At time T4, the output of the delay stage (node B) is at the threshold voltage of inverter 44B so that the output of inverters 44B and 44C will change state at about the same time. Thus, it can be seen from the waveforms of FIG. 8 that the rising edge of Out1 is delayed from the input by an amount equal to T2–T1 and the falling edge of Out1 is delayed by an amount equal to T4–T3, with the two delays being independently controllable.

Table 1 below shows the geometry of the eight transistors which make up delay stage 46 and delay stage 48. Each of the transistors is comprised of M number of fingers, with each finger having a length L and width W. Thus, for example, transistor 46A (transistor A) delay stage 46 which controls the delay of signal OUT1 has 10 fingers (M), with each finger having a length (L) of 0.5 units and a width (W) of 1 unit.

TABLE 1

| XISTOR | OUT1 (M L × W) | OUT2 (M L × W) |
|---|---|---|
| A | 20 | 3 |
|   | .5 × 1 | .5 × 2 |
| B | 20 | 3 |
|   | 1.5 × 3 | 1.5 × 2.7 |
| C | 10 | 3 |
|   | 1.5 × 3 | 1.5 × 1.5 |
| D | 10 | 3 |
|   | .5 × 1 | .5 × 1 |

Figure 9:
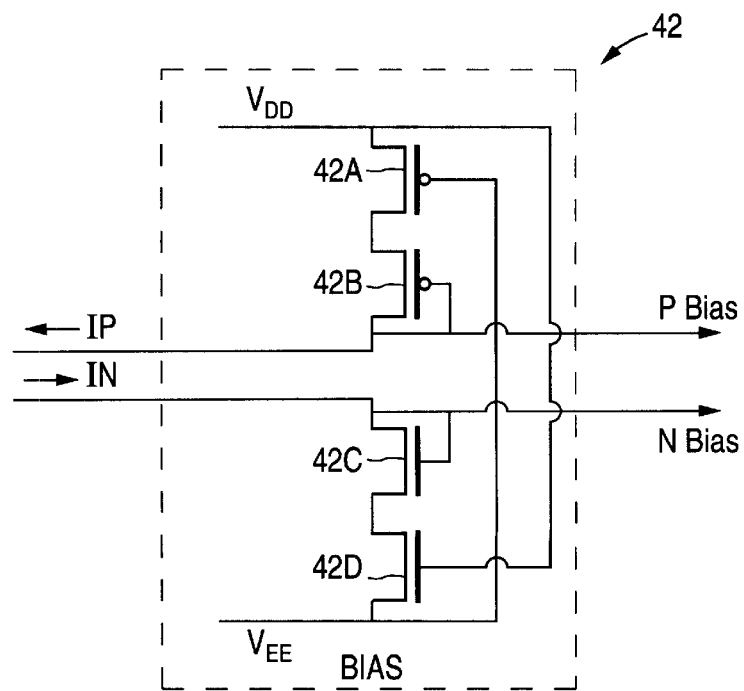
FIG. 9 is a schematic diagram of a bias circuit for generating adjustable bias voltages used to control the amount of delay produced by the Master Delay circuit of FIG. 7 and related circuits.

FIG. 9 is a schematic diagram of the bias generator circuit 42 used to control duration of the two delays produced by the Master Delay 34. The circuit includes a pair of P-type transistors 42A and 42B and a pair of N-type transistors 42C and 42D. The gate of transistor 42A is connected to the circuit common $V_{EE}$ so that transistor 42A is permanently on. The gate and drain of transistor 42B are connected to a current source IP (not depicted) which sinks a controlled amount of current. The current flow through transistors 42A and 42B causes voltage P Bias to be produced having a magnitude equal to the sum of the drain-source voltage of conducting transistor 42A and the gate-source voltage of transistor 42B subtracted from supply voltage $V_{DD}$.

Referring back to FIG. 7, it can be seen that when the input to the delay stage 46 is at a relatively low voltage, the drop across on transistor 46A will be similar to the drop across transistor 42A so that the gate-source voltage across 42B will be close to the gate-source voltage across 46B. Thus, transistors 42B and 46B operate as a current mirror, with the current IP being mirrored in transistor 46B, with the actual current being determined by the relative geometry of the two transistors. Thus, by controlling the relative geometries and by controlling the magnitude of current IP, it is possible to precisely control the rise transition time of the delay stage 46 and therefore the total delay produced between the rising edge of input In and the rising edge of output Out1.

Referring again to FIG. 9 bias circuit, N-type transistor 42D has the gate connected to voltage $V_{DD}$ so that the transistor is permanently conductive. The gate and source of N-type transistor 42C are connected to an external bias current supply which sources a precisely controlled current IN. Transistor 42C of the bias circuit 42 and transistor 46C of the delay stage 46 operate together as a current mirror so that the fall time of the delay stage 46 output can be controlled by adjusting the relative geometries of transistors 42C and 46C. Thus, the fall time of the delay stage 46 output and the total delay between a falling edge of input In and output Out1 can be precisely controlled by adjusting the magnitude of current IN.

Referring again to FIG. 5, currents IP and IN are produced by a pair of identical Digital-To-Analog Converters (DACs) 41A and 41B. The magnitude and polarity of the current generated by DAC 41A is control by bits P0 through P3 and the magnitude and polarity of the current generated by DAC 41B is controlled by bits N0 through N3.

Figure 10:
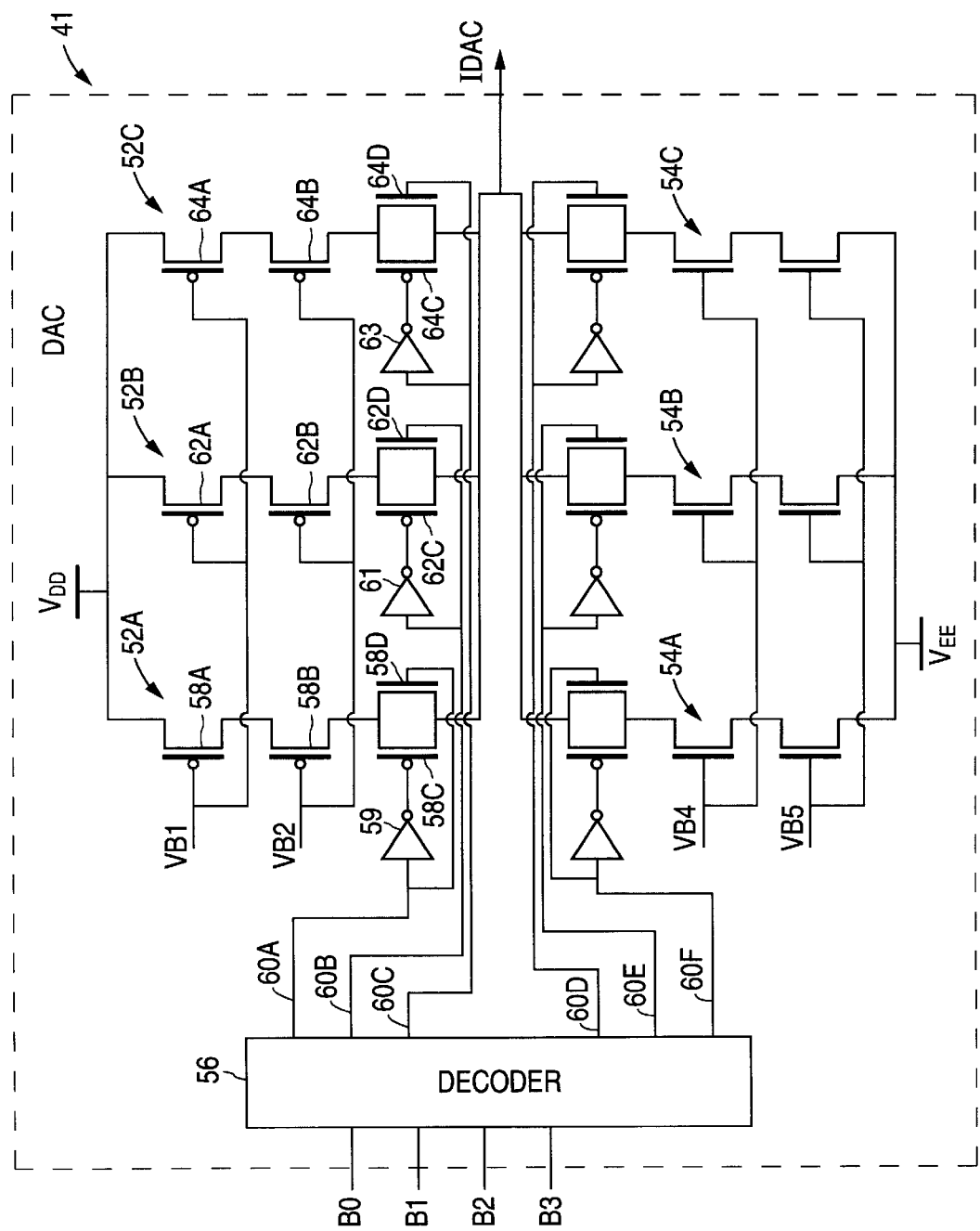
FIG. 10 is a schematic diagram of a digital-to-analog converter circuit (DAC) for generating an analog current used to control the magnitude of the delays produced by the Master Delay circuit of FIG. 7 and related circuits.

FIG. 10 is a schematic diagram of a DAC 41 suitable for use as DAC 41A and DAC 41B. DAC 41 includes three current sources 52A, 52B and 52C which can be selectively switched on and off for sourcing current at output IDAC and three current sources 54A, 54B and 54C which can be selectively switched on and off for sinking current at output IDAC. The state of the six current sources is controlled by decoder 56 which receives the digital input to the DAC, inputs B0, B1, B2 and B3. Current source 52A includes P-type transistors 58A and 58B connected in series, with the gate of transistor 58A being connected to a fixed bias voltage VB1 and the gate of transistor 58B being connected to a fixed bias voltage VB2. Transistors 58C and 58D and inverter 59 form a complementary switch, the state of which is controlled by Decoder output 60A. Current sources 52B and 52C are similar in construction to current source 52A except that transistors 62A and 62B have one-half the effective width as do transistors 58A and 58B. Since the bias voltages VB1 and VB2 connected to the gates of transistors 62A and 62B is the same as connected to transistors 58A and 58B, respectively, the current produced by source 52B is one-half that of source 52A. The output of current source 52B is controlled by a complementary switch made up of transistors 62C and 62D and inverter 61, with the state of the switch being controlled by Decoder output 60B. Current source 52C is connected to bias voltages VB1 and VB2, with transistors 64A and 64B having one-fourth the effective width of the transistors of current source 52A. Thus, current source 52C will source one-fourth the current as current source 52A and one-half the current of current source 52B. Current source 52C is controlled by a complementary switch which includes transistors 64C and 64D together with inverter 63.

The current sources 54A, 54B and 54C which sink current are similar to sources 52A, 52B and 52C except they are implemented using N-type transistors and are biased by bias voltages VB4 and VB5. Source 54A, 54B and 54C are each controlled by complementary switches, the states of which are controlled by Decoder outputs 60F, 60E and 60D, respectively. The effective channel widths of the current source transistors are such that source 54B produces one-half the current of source 54A and source 54C produces one-fourth the current of source 54A.

The most significant bit B3 determines whether the DAC 41 will source current so as to produce output IP (FIG. 5) or will sink current so as to produce output IN. If B3 is a "1", for example, Decoder outputs 60A, 60B and 60C will all be inactive so that sources 52A, 52B and 52C are all switched off. Bits B0, B1 and B2 then operate to produce the eight combinations of current sources 54A, 54B and 54C thereby producing eight different levels of output currents IN which can be changed in increments equal in size to the output of source 52C. If B3 is inactive, Decoder outputs 60D, 60E and 60F will be inactive and the eight combination of outputs 60A, 60B and 60C will cause current sources 52A, 52B and 52C to be switched off. Decoder outputs 60D, 60E and 60F then operate to control current sources 54A, 54B and 54C so as to provide eight different levels of output current IP.

Figure 11A:
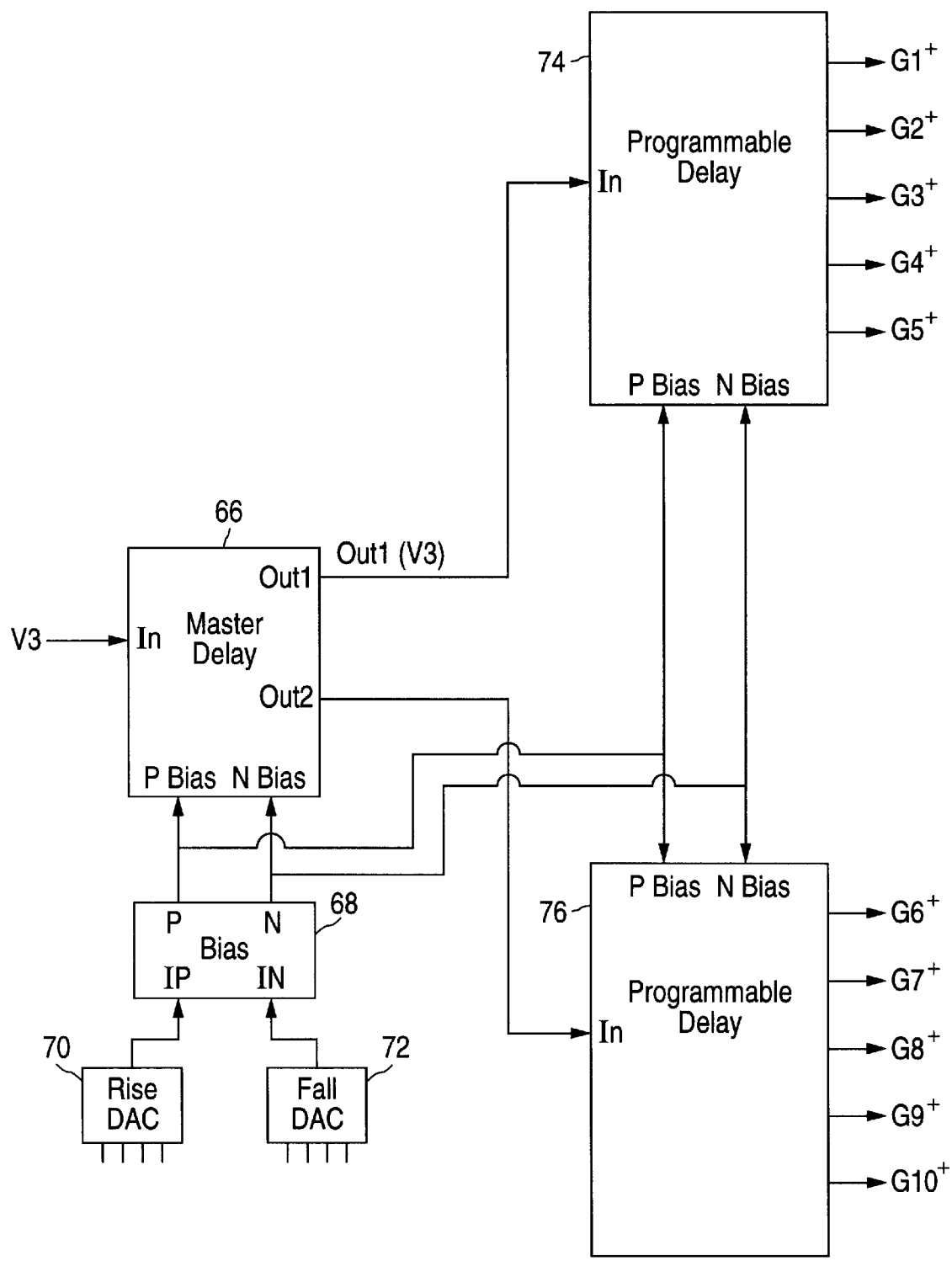
FIGS. 11A and 11B are block diagrams of the circuitry for producing the delayed output signals used to control the output signal rise and fall times.
Figure 11B:
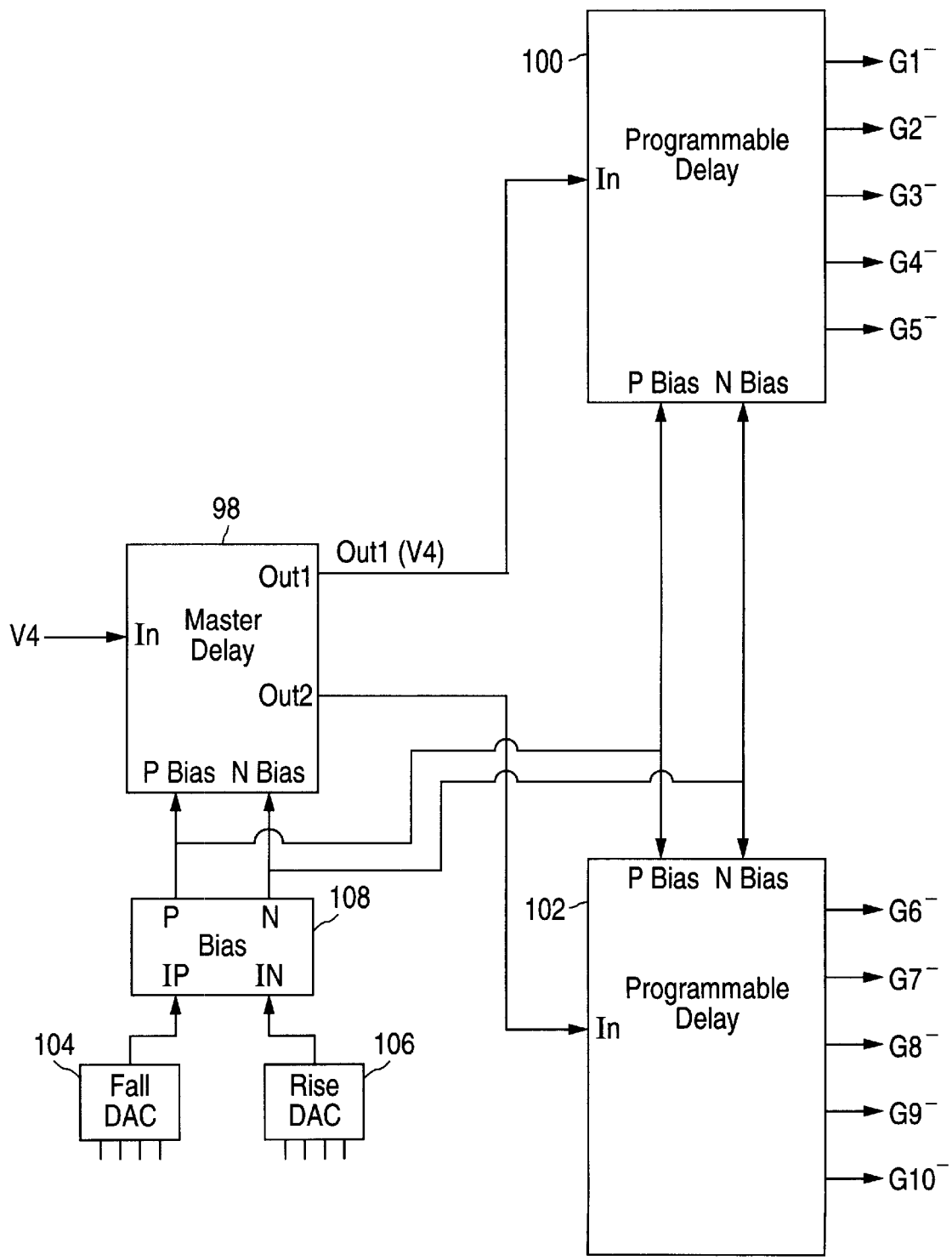

The circuitry for generating delayed signals G1+ through G10+ from signal V3 (FIG. 5) is shown in FIG. 11A. Similar circuitry depicted in FIG. 11B is used to generate delayed signals G1– through G10– from signal V4 (FIG. 5). Referring to FIG. 11A, a Master Delay circuit 66, similar in construction to delay circuit 43 of FIG. 7, receives signal V3 and produces the two delay signals Out1 and Out2. Delayed signal Out1, sometimes referred to as Out1(V3), is used by a Programmable Delay circuit 74 to produce delayed signals G1+ through G5+. Delayed signal Out2 is used by a Programmable Delay circuit 76 to produce delayed signals G1+ through G10+.

A bias generator circuit 68, similar in construction the bias generator circuit 42 of FIG. 9, produces bias voltages P Bias and N Bias, with voltage P Bias being used to control the delay between rising edge of signal V3 and the rising edges of signals Out1 and Out2. Voltage P Bias is also used by Programmable Delay circuit 74 to control the delay between the rising edge of Out1 and the rising edges of delayed signals G1+ through G5+ and by Programmable Delay circuit 76 to control the delay between the rising edge of Out2 and the rising edges of G6+ through G10+. Bias voltage N Bias is used to control the delay between the falling edges of V3 and Out2, between the falling edges of V3 and Out2 and between the falling edges of Out2 and delayed signals G6+ through G10+. A DAC 70, similar in construction to DAC 41 (FIG. 10), sinks an output current IP having a magnitude which is controlled by the DAC digital input and which operates to vary the magnitude of bias voltage P Bias. DAC 72 sources an output current IN having a magnitude which is controlled by the DAC digital input and which operates to vary the magnitude of bias voltage N Bias.

FIGS. 13A through 13E are schematic diagrams of the individual delay circuits which make up Programmable Delay circuit 74. The individual delay circuits 78 (FIG. 13A), 80 (FIG. 13B), 82 (FIG. 13C), 84 (FIG. 13D) and 86 (FIG. 13E) are similar in construction and operation to the FIG. 7 delay stages 46 and 48 and differ only in terms of transistor geometry. All of the delay stages receive identical bias voltages P Bias and N Bias. Delay stage 78 (FIG. 13A), which controls the delay of delayed signal G1+, has relatively large geometry transistors so as to produce a relatively short delay whereas the transistors of delay stage 86 (FIG. 13E) are relatively small so as to produce a greater delay for delayed signal G5+. The geometries of the transistors of delay stages 80, 82 and 84, which control the delay of delayed signals G2+ through G4+, respectively, fall intermediate that of stages 78 and 86. Table 2 below shows the relative size of the four transistors (A, B, C and D) which comprise the five delay stages 78 (G1+), 80 (G2+), 82 (G3+), 84 (G4+) and 86 (G5+). Each transistor is comprised of M number of fingers, with each finger having a length L and width W. By way of example, as indicated in Table 2, transistor 78A (transistor A) of delay stage 78, which controls the delay of delayed signal G1+, is comprised of 10 (M) fingers, with each finger having a length (L) of 0.5 units and a width (W) of 2 units. Transistor 78B (transistor B) is comprised of 10 (M) fingers, with each finger having a length (L) of 1.5 units and a width (W) of 3 units.

TABLE 2

| XISTORS | G1+ (M L × W) | G2+ (M L × W) | G3+ (M L × W) | G4+ (M L × W) | G5+ (M L × W) |
|---|---|---|---|---|---|
| A | 10 .5 × 2 | 7 .5 × 2 | 5 .5 × 2 | 4 .5 × 2 | 3 .5 × 2 |
| B | 10 1.5 × 3 | 7 1.5 × 3 | 5 1.5 × 3 | 4 1.5 × 3 | 3 1.5 × 3.4 |
| C | 10 | 7 | 5 | 4 | 3 |

TABLE 2-continued

| XISTORS | G1+ (M L × W) | G2+ (M L × W) | G3+ (M L × W) | G4+ (M L × W) | G5+ (M L × W) |
|---|---|---|---|---|---|
| D | 1.5 × 1.5 10 .5 × 1 | 1.5 × 1.5 7 .5 × 1 | 1.5 × 1.5 5 .5 × 1 | 1.5 × 1.5 4 .5 × 1 | 1.5 × 1.7 3 .5 × 1 |

Programmable Delay circuit 76 is identical in construction, including the size of delay, as circuit 74. By way of example, signal G6+ is delay from input Out2 the same amount that signal G1+ is delayed from input Out1 and signal G7+ is delayed from input Out2 the same amount that signal G2+ is delayed from input Out1.

Figure 12:
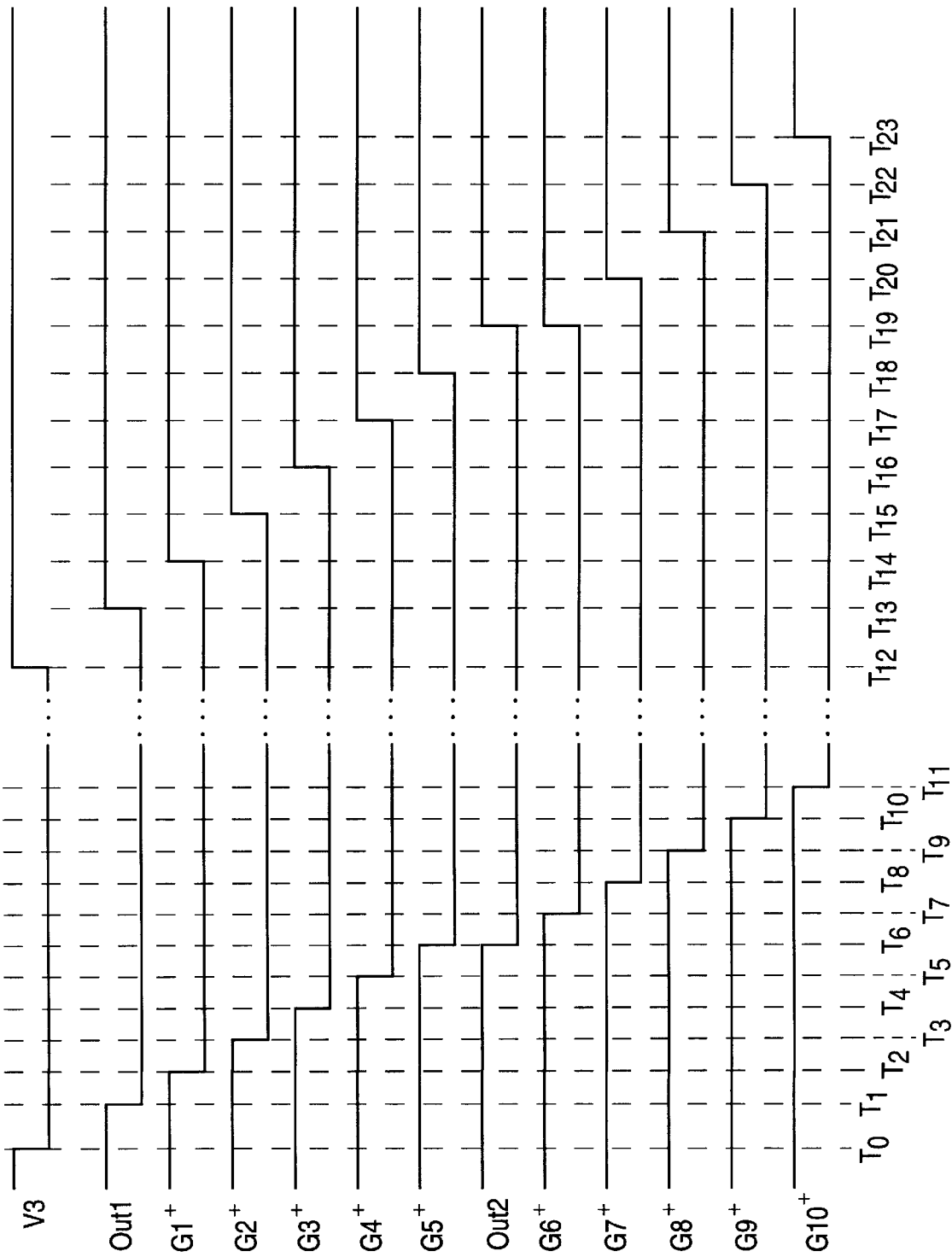
FIG. 12 is a timing diagram illustrating the operation of the circuitry of FIGS. 11A and 11B for producing the delayed output signals.

FIG. 12 is a timing diagram illustrating the delays provided by the Master Delay circuit 66 (FIG. 11A) and the two Programmable Delay circuits 74 and 76. As previously explained, signal V3 is represents input V1 after duty cycle compensation as illustrated in FIG. 5. Signal V3 is connected to the input of Master Delay circuit 66 (FIG. 11A) and produces a first delayed output Out1 and a second delayed output Out2. The difference in delay between outputs Out1 and Out2 is essentially determined by the difference in transistor area for the two delay stages 46 and 48 which comprise the Master Delay circuit 66. As previously noted, the difference in delay is one nanosecond in the present exemplary embodiment for particular values of P Bias and N Bias. Thus, referring to the timing diagram of FIG. 12, V3 goes low at time T0 so that after a delay, Out1 goes low at time T1. Signal Out2 also goes low in response to V3 going low at time T6. The difference between time T0 when signal Out1 goes low and time T6 when signal Out2 goes low is one nanosecond. Reference is also made to the timing diagram of FIG. 4, although the time scale between FIG. 4 and FIG. 12 is not the same.

Note that when V3 goes low, the output of AND gate 28 (FIG. 3) will go low. This will cause P-type transistor 18 to become conductive. Both V4 and G10– are high at this time so that the output of gate 30 will be high causing P-type transistor to remain off.

Figure 13A:
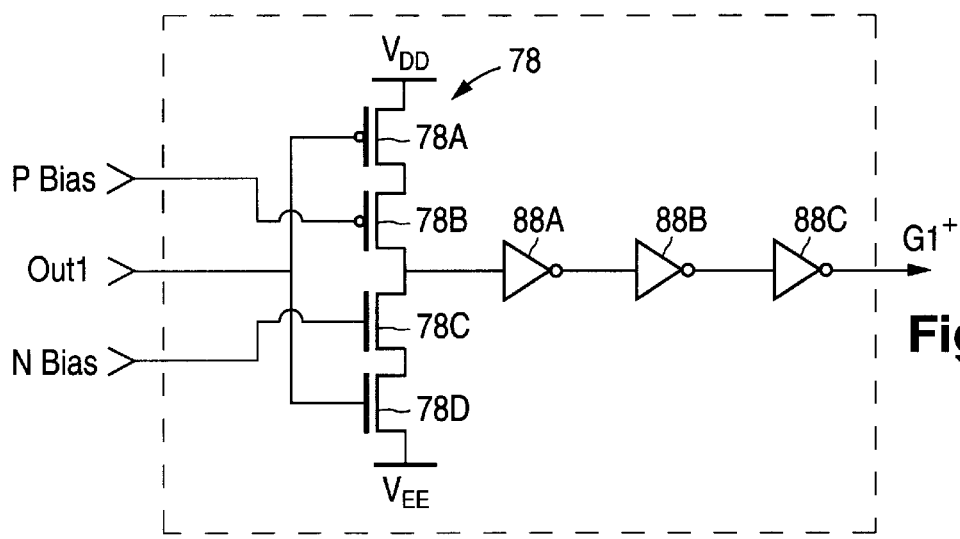
FIGS. 13A through 13E are schematic diagrams of the delay stages used to generate delayed signals G1+ through G5+, respectively.
Figure 13B:
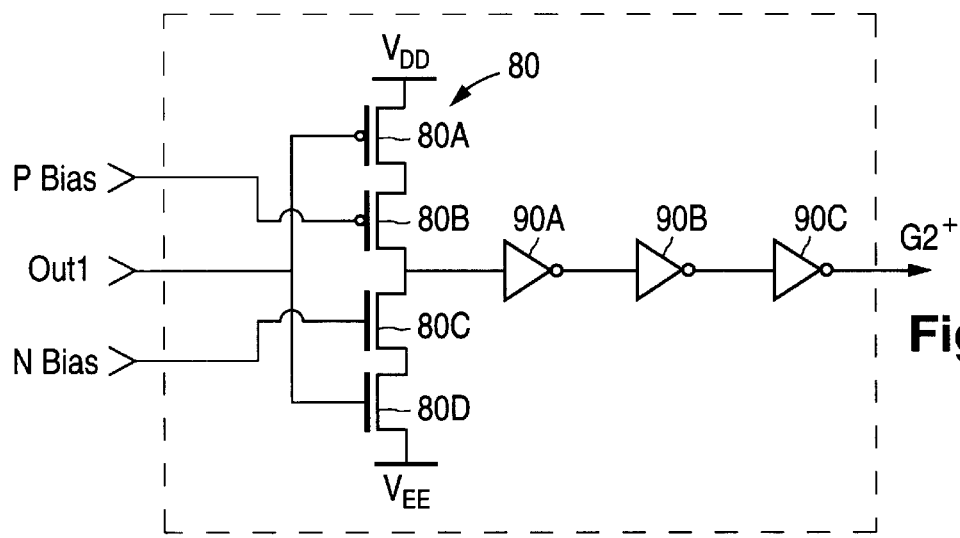
Figure 13C:
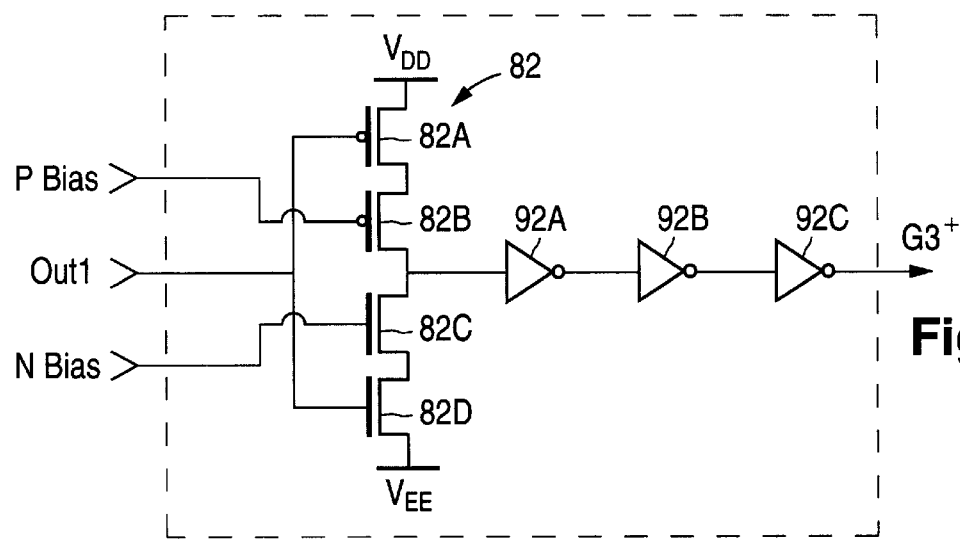
Figure 13D:
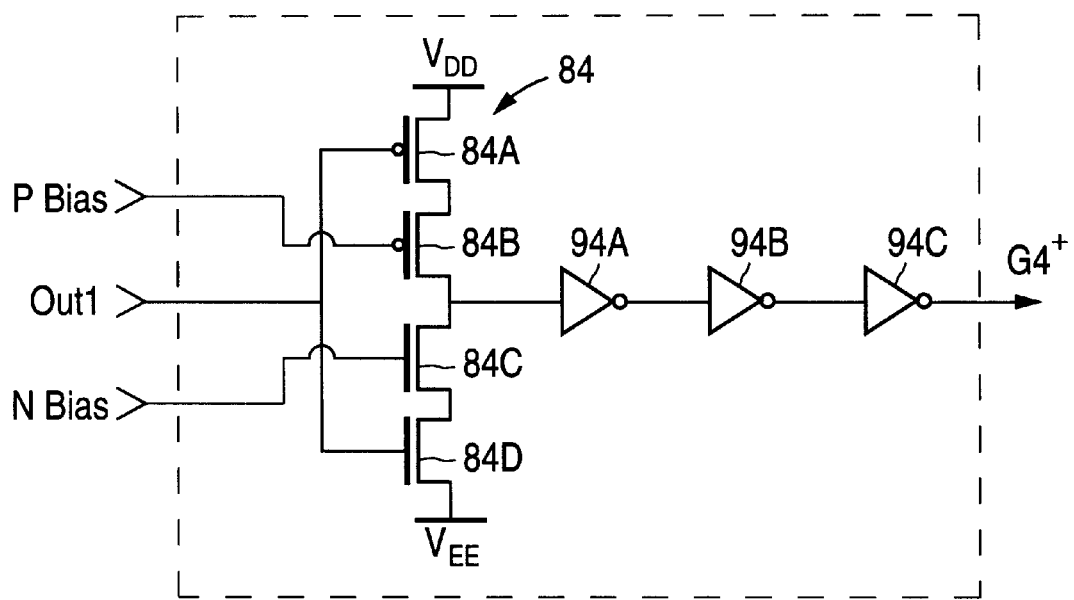
Figure 13E:
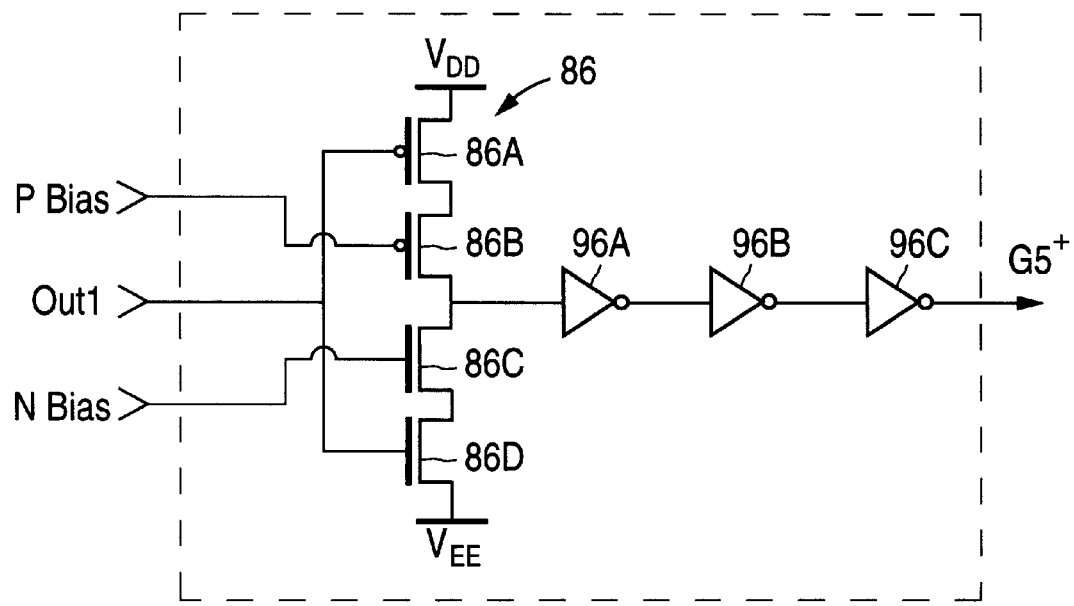

When signal Out1 goes low at T1, a delay is introduced by the delay circuit of FIG. 13A, with the magnitude of the delay being determined primarily by the geometry of transistor 78B and the magnitude of the bias voltage P Bias. After a delay from time T1 to T2, output G1+ of the FIG. 13A circuit will go active (low). This delay is optimally 200 picoseconds for the bias voltage P Bias being used. As previously explained, this will cause a first one of the P-type transistors in transistor array 24 (FIG. 3) to turn on so that one of the ten 2 milliampere current outputs of current source circuit 25 will flow through transistor 18 and the equivalent load resistor 16. Thus, the voltage across resistor 16, Vout, will increase from 0 to 100 millivolts at time T2. Similarly, at time T3, 200 picoseconds after T1, delayed signal G2+ will go active thereby turning on a second one of the P-type transistors of array 24 (FIG. 3). Thus, the current through equivalent load resistor 16 will increase from 2 to 4 milliamperes so that Vout will increase from 100 to 200 millivolts. Delayed signals G3+ and G4+ will go active 200 picoseconds (T4) and 400 picoseconds (T5) later, respectively, after T4. Vout will thus increase from 200 to 300 millivolts at time T4 and from 300 to 400 millivolts at time T5. Delayed signal G5+ will go active 200 picoseconds later at time T6 thereby increasing the current flow by 2 milliamperes. Thus, at 1000 picoseconds (one nanosecond) Vout will increase to 500 millivolts.

As previously noted, at one nanosecond after Out1 goes low, Out2 will go low at time T6. This will cause a delay circuit, identical to the delay circuit of FIG. 13A, to make delayed signal G6+ to go active 200 picoseconds later. Thus, at time T7, the current through resistor 16 will increase by 2 milliamperes so that Vout will increase an additional 100 millivolts. Signals G6+, G7+, G8+, G9+ and G10+ will go active at 200 picosecond intervals so that Vout will increase in 100 millivolt increments until time T11 when Vout will be at +1 volt. Thus, Vout is linearly increased from 0 to +1 volt in 100 millivolt increments each 200 picoseconds. It can be seen that Vout has a well controlled rise transition time of 2 nanoseconds. The rise time can be altered by altering the digital input to DAC 70 (FIG. 11A) thereby changing the magnitude of voltage P Bias. An increase in P Bias will proportionally reduce the delays produced at the falling edges of Out1, Out2 and G1+ through G10+. Delayed outputs G1+ through G10+ will be produced at approximately equal time intervals throughout the rise transition time so that Vout will increase linearly during the rise time period. Similarly, the rise transition time can be decreased by reducing the magnitude of voltage P Bias.

Eventually, input Vin1 will go high thereby causing V3 to go high at time T12. As will be explained, this will cause Vout to proceed to drop from the maximum value of +1 volt back to 0 volts. Transistor 18 will remain on even though V3 is high since G10+ will remain low until time T21. This will cause the output of gate 28 (FIG. 3) to remain low until time T21 thereby keeping transistor 18 on. At time T13, signal Out1 will go high in response to V3 going high. This will cause delayed signal G1+ to go high at time T14 thereby turning off one of the P-type transistors in array 24. This will cause the total current in resistor 16 to drop from 20 milliamperes to 18 milliamperes. Thus, Vout will drop from +1 volt to 0.9 volts, thereby starting the fall time period of Vout. The delay from T13 to T14 is determined primarily by the geometry of transistor 78C of delay circuit 78 (FIG. 13) and the N Bias voltage. In the present example, the fall time is set to be larger than the 2 nanosecond rise time so as to illustrate that the rise and fall transition times can be set independent of one another.

The fall time is controlled by adjusting the digital input to DAC 72 thereby changing the N Bias voltage which is used by the Master Delay circuit 66 and the Programmable Delay circuits 74 and 76. At time T15, delayed signal G2+ will go high reducing the current through resistor 16 by 2 milliamperes and reducing Vout to 0.8 volts. Vout will continue to decrease linearly in 100 millivolt increments until time T23 when G10+ goes high thereby turning off all of the transistors of array 24. At the same time, both inputs to AND gate 28 will go high thereby turning off transistor 18.

As previously noted, delayed signals G1– through G10– are produced from signal V4 in the same manner as delayed signals G1+ through G10+ are produced from signal V3. The circuitry for generating G1– through G10– is shown in FIG 11B. Master delay circuit 98, bias circuit 108, Programmable Delay circuits 100 and 102 correspond in construction and operation to circuits 66, 68, 74 and 76, respectively, of FIG. 11A. Signals V4 and G10– cause transistor 20 (FIG. 3) to be conductive during the relevant time period so that current can flow through load resistor 16 from terminal B to terminal A and through the selectively enabled transistors of array 22. DAC 104 controls the fall transition time of Vout, the time period where Vout goes from 0 to –1 volt as shown, for example, in the FIG. 4 timing diagram from time T8 to T9. DAC 106 controls the rise transition time of Vout, the period where Vout goes from –1 to 0 volts as indicated, for example, from T10 to T11.

Note that the rise and fall transitions in Vout are each generated in ten increments each (G1+ through G10+ and G1– through G10–). If greater precision is required, the number of increments used can be increased. Similarly, if less precision in necessary fewer than ten increments can be used.

Figure 14:
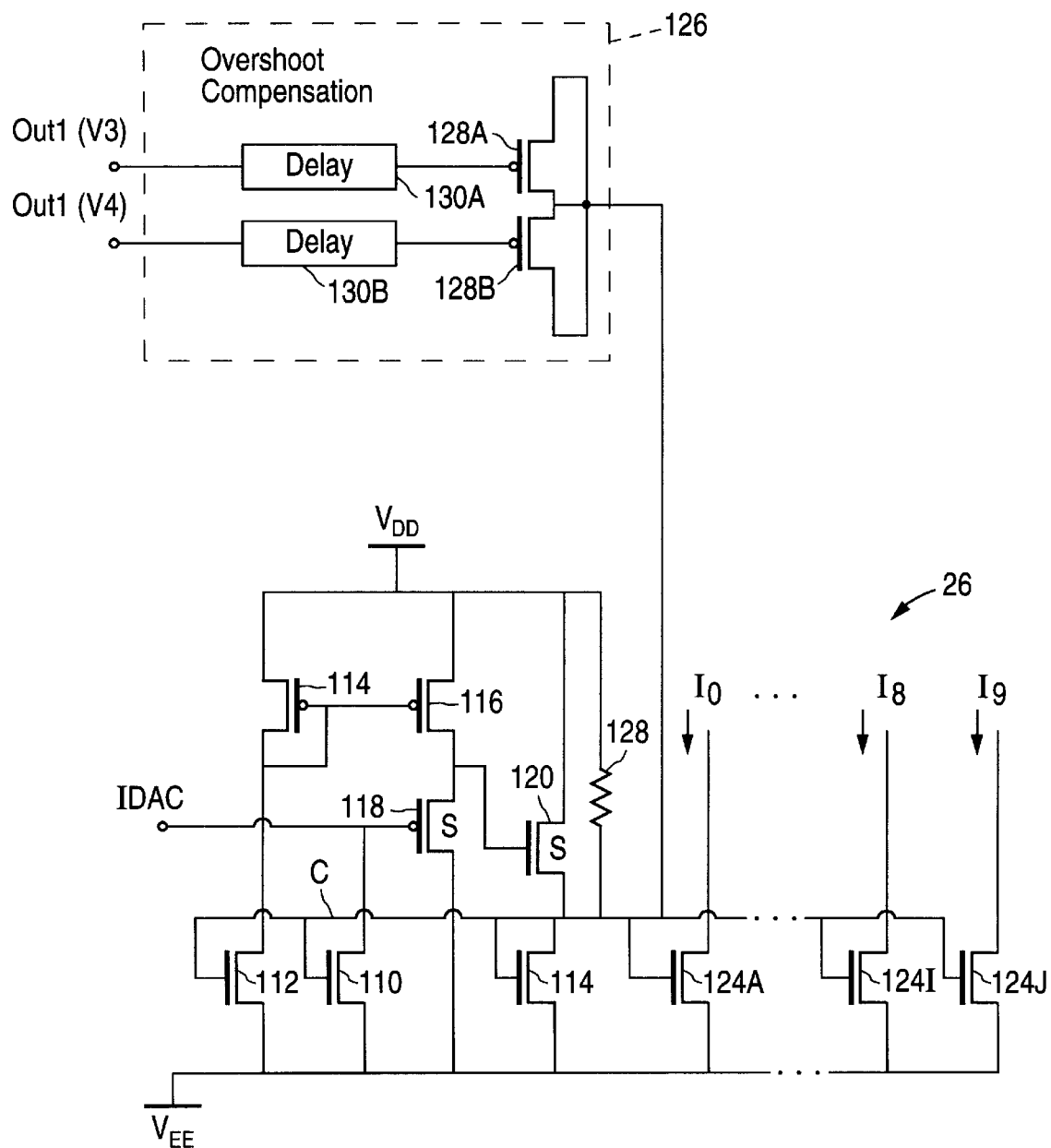
FIG. 14 is a schematic diagram of a current source circuit for producing the multiple current outputs for the driver circuit.

FIG. 14 is a detailed circuit diagram of the current source circuit 26 which provides the ten different 2 milliampere current outputs I0 through I9. The current source circuit 26 is implemented in a manner such that the circuit can operate from an input current source operating at a relatively small voltage and is capable of operating at high frequencies. An Overshoot Compensation circuit 126 is provided for adjusting the magnitude of the output current during part of the output cycle so as to control overshoot.

A precision current source, such as a bandgap current source (not depicted), is provided for sourcing a current IDAC. IDAC is nominally set to 0.2 milliamperes in the present example. It would also be possible to generate current IDAC for a DAC to provide additional control over the shape of output Vout. Current IDAC flows through an input transistor 110, the gate of which is biased above the threshold voltage by way of a large value resistor 128 connected to supply $V_{DD}$. The gate of transistor 110, node C, will be at a voltage equal to the threshold voltage of the transistor plus some overdrive voltage. Transistor 112, having a gate also connected to node C will also conduct a current which will be mirrored by transistors 114 and 116.

P-type transistor 118 is configured as a source follower circuit, with transistor 116 acting as a current source load. The output of the source follower is connected to the gate of an N-type transistor 120 which is also configured as a source follower. A diode connected transistor 114 is connected as a load for the second source follower. The output of the second source follower is connected to node C. It can be seen by inspection that the difference between the drain and gate voltage of input transistor 110 is equal to the difference between the gate-source voltages of transistors 118 and 120. These transistors have a geometry and operate at current levels such that the gate-source voltage of transistor 118 is greater than that of transistor 120. Thus, the drain of transistor 110 will operate at a voltage lower than the gate voltage thereby allowing the input current source IDAC to operate at a reduced voltage. Care should be taken to ensure that the drain voltage of the input transistor 110 is large enough to maintain the transistor in the saturation mode.

Node C is connected to the gates of the ten current source transistors 124A through 124J, each of which has a geometry the ten times larger than that of input transistor 110. Thus, each of the ten transistors will sink a current of 2 milliamperes, that being equal to ten times the input current IDAC. Since node C is driven by source follower transistor 120 having a low output impedance, the relatively large capacitances associated with the node can be driven at a high frequency. Further, the two source follower transistors 118 and 120 operate to isolate the output of the source of input IDAC from the noise created on node C when the transistors of arrays 22 and 24 (FIG. 3) are switched on and off.

In some applications, there is a tendency for output Vout to ring at either the rising or falling edge of the signal. An Overshoot Compensation circuit 126 having an output coupled to node C can be used to momentarily alter the voltage at the node so as to reduce the current produced by the current source circuit 26 at the point in time where ringing occurs. Signal Out1(V3), which is produced by Master Delay circuit 66 (FIG. 11A) goes active during the period when Vout goes positive such as time T4 (FIG. 4). A delay circuit 130A comprising several conventional inverters connected in series, produces a negative going output which is capacitively coupled to node C by way of transistor 128A which is connected as a capacitor. This will cause the voltage at node C to momentarily drop thereby reducing the current flow through the load resistor 16 (FIG. 3) at a time around T5 where the overshoot has been found to be occurring. Signal Out1(V4), in combination with delay 130B and capacitor 128B performs a similar function on Vout when Vout is going negative such as time T9 (FIG. 4). Since there is no need in the present application to adjust the falling edges of Vout, the delay circuits 130A and 130B are adjusted so that the falling edges of Vout are not affected. This is accomplished by adjusting the delays so that the output of the overshoot circuit 126 goes low when current flow though load resistor 16 has already fallen to zero. Thus, although the drop in the output of overshoot circuit 126 will momentarily lower the voltage on node C, the Vout waveform will be unaltered since the current in resistor 16 is already zero.

The above-described driver circuit provides an output signal Vout having rise and fall transition times that can be independently controlled and which remain stable notwithstanding changes in temperature, supply voltage and process variations. Further, the duty cycle compensation aspect of the driver circuit is capable of compensating the duty cycle distortion introduced by the rise and fall time control mechanism over all operating conditions. Table 3 below shows the measured data for an exemplary driver circuit implemented in silicon and operating at a data rate of 62.5 Megabits. Measurements TR+ and TF+ are the rise and fall transition times of the positive going pulse of Vout in terms of nanoseconds (ns), measurements TR+ and TF+ are the rise and fall transition times of the negative going pulse of Vout in nanoseconds. DCD is determined by measuring the positive and negative pulse widths at the 50% point together with the width between the pulses. Each of these three measurements is nominally 16 nanoseconds, with Table 3 setting forth the time in picoseconds (ps) that the worse case one of the three measurements deviates from 16 nanoseconds.

TABLE 3

| | TR+ (ns) | TF+ (ns) | TR− (ns) | TF− (ns) | DCD (ps) |
| --- | --- | --- | --- | --- | --- |
| 4.5 V 80° C. | 4.12 | 3.92 | 4.07 | 3.96 | 270 |
| 5.0 V 25° C. | 3.69 | 3.63 | 3.61 | 3.69 | 210 |
| 5.5 V −10° C. | 3.52 | 3.56 | 3.52 | 3.62 | 280 |

Thus, a novel signal shaping circuit for controlling slew rate and duty cycle has been disclosed. Although one embodiment of the invention has been described in the form of a driver circuit, it is to be understood that the subject invention can be used in other applications where it is imperative that rise and fall transition times be precisely controlled. Further, the controlled delay lines of the driver circuit are shown operating open loop, but could easily be modified to run closed loop using, for example, a Dealy locked loop. In addition, although one embodiment has been described in some detail, changes could be made by those skilled in the art without departing from the spirit and scope of the invention as defined by the appended claims.

What is claimed is:

1. A signal shaping circuit for producing a first output signal having independently controllable rise and fall transition times from a first input pulse signal, said signal shaping circuit comprising:

a first delay circuit configured to produce in a first sequence of multiple delayed outputs response to a transition of the first input pulse signal in one direction and to produce a second sequence of multiple delayed outputs in response to a transition of the first input pulse signal in an opposite direction, with said first delay circuit being responsive to a delay control input for independently controlling the first and second sequences of multiple delayed outputs; and first transition control circuitry configured to control a transition time of the first output signal in one direction in response to the first sequence of multiple delayed outputs and to control a transition time of the first output signal in an opposite direction.

2. The signal shaping circuit of claim 1 further comprising an output impedance across which the first output signal is produced and wherein the first transition control circuitry operates to incrementally increase current flow through the output impedance in response to production of each of the multiple delayed outputs of the first sequence and to incrementally decrease current flow through the output impedance in response to production of each of the multiple delayed outputs of the second sequence.

3. The signal shaping circuit of claim 2 wherein the first delay circuit includes first and second delay stages which produce first and second delayed outputs, respectively, of the first sequence and which produce third and fourth delayed outputs, respectively, of the second sequence.

4. The signal shaping circuit of claim 3 wherein the first delay circuit includes first transition time control circuitry configured to control a magnitude of delay of the first sequence of multiple delayed outputs from the one direction transition of the first input pulse signal and second transition time control circuitry, separate from the first transition time control circuitry, configured to control a magnitude of delay of the second sequence of multiple delayed outputs from the opposite direction transition of the first input pulse signal.

5. The signal shaping circuit of claim 4 wherein the delay stages each include a inverter circuit with an output having a transition time in one direction which is controlled by the first transition time control circuitry and a transition time in an opposite direction which is controlled by the second transition time control circuitry.

6. The signal shaping circuit of claim 5 wherein the inverter circuits each include first current control circuitry for controlling current flow in the inverter when the output is transitioning in the one direction and second current control circuitry for controlling current flow in the inverter when the output is transitioning in the opposite direction.

7. The signal shaping circuit of claim 6 wherein the inverter circuits include first and second P-type transistors and first and second N-type transistors defining drain-source paths connected in series, with a common gate connection of the first P-type and N-type transistors forming an input of the inverter and with a common drain connection of the second P-type and N-type transistors forming the output of the inverter and with the first transition time control circuitry being coupled to a gate of the second P-type transistor and with the second transition time control circuitry being coupled to a gate of the second N-type transistor.

8. The signal shaping circuit of claim 7 wherein the first transition time control circuitry includes a first bias voltage generating circuit configured to apply a first bias voltage to the gate of the second P-type transistor of the inverters and the second transition time control circuitry includes a second bias voltage generating circuit configured to apply a second bias voltage to the gate of the second N-type transistor of the inverters.

9. The signal shaping circuit of claim 8 wherein the first bias voltage generating circuit includes a first digital-to-analog converter circuit having first a digital input, related to the delay control input, for altering a magnitude of the first bias voltage and wherein the second bias voltage generating circuit includes a second digital-to-analog converter circuit having a second digital input, related to the delay control input, for altering a magnitude of the second bias voltage.

10. The signal shaping circuit of claim 1 wherein the pulse shaping circuit further operates to produce a second output signal from a second input pulse signal, with the second output signal having a polarity opposite of the first output signal and with the second input pulse signal being separated in time from the first input pulse signal, with the first and second output signals having independently controllable rise and fall transition times, said signal shaping circuit further comprising:
    a second delay circuit configured to produce a third sequence of multiple delayed outputs in response to a transition of the second input pulse signal in one direction and to produce a fourth sequence of multiple delayed outputs in response to a transition of the second input pulse signal in an opposite direction, with the third delay circuit being responsive to the delay control input for independently controlling the third and fourth sequences of multiple delayed outputs; and
    second transition control circuitry configured to control a transition time of the second output signal in one direction in response to the third sequence of multiple delayed outputs and to control the transition time of the second output signal in an opposite direction in response to the fourth sequence of multiple delayed outputs.

11. The signal shaping circuit of claim 10 further comprising an output impedance across which the first and second output signals are produced and wherein the first transition control circuitry operates to incrementally increase current flow through the output impedance in one direction in response to production of each of the multiple delayed outputs of the first sequence, to incrementally decrease current flow through the output impedance in the one direction in response to production of each of the multiple delayed outputs of the second sequence, to incrementally increase current flow through the output impedance in an opposite direction in response to production of each of the multiple delayed outputs of the third sequence of delayed signals and to incrementally decrease current flow through the output impedance in response to production of each of the multiple delayed outputs of the fourth sequence.

12. A signal shaping circuit for producing a first output signal across an impedance having controllable rise and fall transition times from a first input pulse signal, said signal shaping circuit comprising:
    a first delay circuit configured to produce a first sequence of multiple delayed outputs in response to a transition of the first input pulse signal in one direction and to produce a second sequence of multiple delayed outputs, in response to a transition of the first input pulse signal in an opposite direction, with said first delay circuit being responsive to a delay control input for independently controlling the first and second sequences of multiple delayed outputs; and
    current control circuitry configured to incrementally increase current flow through the impedance in one direction in response to the first sequence of multiple delayed outputs so as to control a transition time of the first output signal in one direction and to incrementally decrease current flow through the impedance in the one direction in response to the second sequence of multiple delayed outputs so as to control a transition time of the first output signal in an opposite direction.

13. The signal shaping circuit of claim 12 wherein the current control circuit includes multiple current source outputs which are sequentially connected to a first terminal of the load impedance in response to the first sequence of multiple delayed outputs and which are sequentially disconnected from the first terminal in response to the second sequence of multiple delayed outputs.

14. The signal shaping circuit of claim 13 wherein the current control circuit includes a first multiplicity of transistor switches, each having a first terminal connected to a separate one of the current source outputs and a second terminal connected to the first terminal of the load impedance and a control terminal connected to receive one of the multiple delayed outputs of the first sequence and one of the multiple delayed outputs of the second sequence.

15. The signal shaping circuit of claim 14 wherein the transistor switches each include a P-type transistor having a source connected to the first terminal of the load impedance, a drain connected to one of the current source outputs and a gate connected so that the transistor is turned on by the delayed output of the first sequence and turned off by the delayed output of the second sequence.

16. The signal shaping circuit of claim 14 which further produces a second output signal across the impedance having controllable rise and fall transition times from a second input pulse signal shifted in time from the first input pulse signal, with said signal shaping circuit comprising a second delay circuit configured to produce a third sequence of multiple delayed outputs in response to a transition of the second input pulse signal in one direction and to produce a fourth sequence of multiple delayed outputs in response to a transition of the second input pulse signal in an opposite direction and wherein the current control circuitry is further configured to incrementally increase current flow through the impedance in a direction opposite the one direction in response to the third sequence of multiple delayed outputs so as to control a transition time of the second output signal in one direction and to incrementally decrease current flow through the impedance in the direction opposite the one direction so as to control a transition time of the second output signal in an opposite direction.

17. The signal shaping circuit of claim 16 wherein the current control circuitry is further configured to sequentially connect a second terminal of the load impedance to the multiple current source outputs in response to the third sequence of multiple delayed outputs and to sequentially disconnect the second terminal from the multiple current source outputs in response to the fourth sequence of multiple delayed outputs.

18. The signal shaping circuit of claim 17 wherein the current control circuit includes a second multiplicity of transistors switches, each having a first terminal connected to one of the current source outputs and a second terminal connected to the second terminal of the load impedance and a control terminal connected to receive one of the multiple delayed outputs of the third sequence and one of the multiple delayed outputs of the fourth sequence.

19. The signal shaping circuit of claim 18 wherein the second multiplicity of transistor switches each include a P-type transistor having a source connected to the second terminal of the load impedance, a drain connected to one of the current source outputs and a gate connected so that the transistor is turned on by the delayed output of the third sequence and turned off by the delayed output of the fourth sequence.

20. A method of producing a first output signal having controllable rise and fall transition times from a first input pulse signal, said method comprising:

providing a delay control input;

generating a first sequence of multiple delayed outputs, having delays controllable by the delay control input, in response to a transition of the first input pulse signal in one direction;

generating a second sequence of multiple delayed outputs, having delays independent of the first sequence of multiple delayed outputs and controllable by the delay control input, in response to a transition of the first input pulse signal in an opposite direction;

producing a transition in the first output signal in one direction having a transition time controlled by the first sequence of multiple delayed outputs; and producing a transition in the first output signal in an opposite direction having a transition time controlled by the second sequence of multiple delayed outputs.

21. The method of claim 20 wherein the generating the first and second sequence includes the following:

providing a multiplicity of delay stages;

controlling current flow in each of the delay stages in response to the delay control input so as to adjust timing of the first sequence of delayed outputs; and controlling current flow in each of the delay stages in response to the delay control input so as to adjust timing of the second sequence of delayed outputs.

22. The method of claim 21 wherein the each of the delay stages includes an inverter circuit having an output, with the controlling current flow so as to adjust timing of the first sequence includes controlling current flow in each of the inverter circuits so as to alter a transition time of the inverter circuit output in one direction and with the controlling current flow so as to adjust timing of the second sequence includes controlling current flow in each of the inverter circuits so as to alter a transition time of the inverter circuit output in an opposite direction.

23. The method of claim 22 wherein the producing a transition in the first output signal in one direction includes incrementally increasing current flow through an output impedance in one direction in response to the generating the first sequence of multiple delayed outputs and wherein the producing a transition in the first output signal in an opposite direction includes incrementally decreasing current flow through the output impedance in the first direction in response to the generating the second sequence of multiple delayed outputs.

24. The method of claim 20 wherein the method of producing a first output signal further includes the production of a second output signal having independently controllable rise and fall transition times from a second input pulse signal translated in time from the first input pulse signal, said method comprising:

generating a third sequence of multiple delayed outputs, having delays controllable by the delay control input, in response to a transition of the second output signal in one direction;

generating a fourth sequence of multiple delayed outputs, having delays independent of the third sequence of multiple delayed outputs and which are controllable by the delay control input, in response to a transition of the second output signal in an opposite direction;

producing a transition in the second output signal in one direction having a transition time controlled by the third sequence of multiple delayed outputs; and producing a transition in the second output signal in an opposite direction having a transition time controlled by the fourth sequence of multiple delayed outputs.

25. The method of claim 24 wherein the producing a transition in the first output signal in one direction includes incrementally increasing current flow in an output impedance in a first direction in response to the first sequence of multiple delayed outputs, the producing a transition in the first output signal in an opposite direction includes incrementally decreasing current flow in the output impedance in the first direction in response to the second sequence of multiple delayed outputs, the producing a transition in the second output signal in one direction includes incrementally increasing current flow in the output impedance in the opposite direction in response to the third sequence of multiple delayed outputs, and the producing a transition in the second output signal in an opposite direction includes incrementally decreasing current flow in the output impedance in the opposite direction in response to the fourth sequence of multiple delayed outputs.

26. A method of producing a first output signal across an output impedance having controllable rise and fall transition times from a first input pulse signal, said method comprising:

providing a delay control input;

generating first through fifth delayed outputs having first through fifth increasing delay periods, the durations of which are controlled by the delay control input, starting from a transition in the first input pulse signal in one direction;

incrementally increasing current flow through the output impedance in a first direction in response to the generation of each of the first through fifth delayed outputs;

generating sixth through tenth delayed outputs having sixth through tenth increasing delay periods, the durations of which are independent of the first through fifth delayed outputs and which are controlled by the delay control input, starting from a transition in the first input pulse signal in an opposite direction; and incrementally decreasing current flow through the output impedance in the first direction in response to the generation of each of the sixth through tenth delayed outputs.

27. The method of claim 26 wherein the first and sixth delayed outputs are generated using a first delay circuit, the second and seventh delayed outputs are generated using a second delay circuit, the third and eighth delayed outputs are generated using a third delay circuit, the fourth and ninth delayed outputs are generated using a fourth delay circuit and the fifth and tenth delayed outputs are generated using a fifth delay circuit.

28. The method of claim 27 wherein each of the delay circuits receive a signal related to the delay control input for controlling a magnitude of the delay produced by the delay circuit starting from the transition of the first input pulse signal in the one direction and and receive a signal related to the delay control input for controlling a magnitude of the delay produced by the delay circuit starting from the transition in the first input pulse signal in the opposite direction.

29. The method of claim 28 wherein the rise transition time of the first output signal is controlled by adjusting a magnitude of a voltage applied to the first inputs of the delay circuits and the fall transition time of the first output signal is controlled by adjusting a magnitude of a voltage applied to the second inputs of the delay circuits.

30. A method of producing first and second output signals across an output impedance from first and second input pulse signals spaced apart in time, with the first and second output signals having controllable rise and fall transition times, said method comprising:

generating first through fifth delayed outputs having first through fifth increasing delay periods starting from a transition in the first input pulse signal in one direction;

incrementally increasing current flow through the output impedance in one direction in response to the generation of each of the first through fifth delayed outputs;

generating sixth through tenth delayed outputs having sixth through tenth increasing delay periods starting from a transition in the first input pulse signal in an opposite direction;

incrementally decreasing current flow through the output impedance in the first direction in response to the generation of each of the sixth through tenth delayed outputs;

generating eleventh through fifteenth delayed outputs having eleventh through fifteenth increasing delay periods starting from a transition in the second input pulse signal in one direction;

incrementally increasing current flow through the output impedance in an opposite direction in response to the generation of each of the eleventh through fifteenth delayed outputs;

generating sixteenth through twentieth delayed outputs having sixteenth through twentieth increasing delay periods starting from a transition in the second input pulse signal in an opposite direction; and incrementally decreasing current flow through the output impedance in the opposite direction in response to the generation of each of the sixteenth through twentieth delayed outputs.

31. The method of claim 30 wherein the first and sixth, the second and seventh, the third and eighth, the fourth and ninth, the fifth and tenth, the eleventh and sixteenth, the twelfth and seventeenth, the thirteenth and eighteenth, the fourteenth and nineteenth and the fifteenth and twentieth delayed outputs are produced by first through tenth delay circuits, respectively.

32. The method of claim 31 wherein each of the first through fifth delay circuits each include a first input for controlling a magnitude of the delay produced by the delay circuit starting from the transition of the first input pulse signal in the one direction and a second input for controlling a magnitude of the delay produced by the delay circuit starting from the transition of the first input pulse signal in the opposite direction and wherein the sixth through tenth delay circuits include a first input for controlling a magnitude of the delay produced by the delay circuit starting from the transition of the second input pulse signal in the one direction and a second input for controlling a magnitude of the delay produced by the delay circuit starting from the transition of the second input pulse signal in the opposite direction.

33. The method of claim 32 wherein the rise transition time of the first output signal is controlled by adjusting a magnitude of a first control voltage applied to the first inputs of the first through fifth delay circuits, the fall transition time of the first output signal is controlled by adjusting a mag-
nitude of a second control voltage applied to the second inputs of the first through fifth delay circuits, the rise transition time of the second output signal is controlled by adjusting a magnitude of a third control voltage applied to the first inputs of the sixth through tenth delay circuits and the fall transition time of the second output signal is controlled by adjusting a magnitude of a fourth control voltage applied to the second inputs of the sixth through tenth delay circuits.

34. The method of claim 33 including generating the first through fourth control voltages using first through fourth digital-to-analog converter circuits, respectively.

35. A signal shaping circuit for producing a first output signal across an impedance having controllable rise and fall transition times from a first input pulse signal, said signal shaping circuit comprising:

a first delay circuit configured to produce a first sequence of multiple delayed outputs in response to a transition of the first input pulse signal in one direction and to produce a second sequence of multiple delayed outputs in response to a transition of the first input pulse signal in an opposite direction; and current control circuitry configured to incrementally increase current flow through the impedance in one direction in response to the first sequence of multiple delayed outputs so as to control a transition time of the first output signal in one direction and to incrementally decrease current flow through the impedance in the one direction in response to the second sequence of multiple delayed outputs so as to control a transition time of the first output signal in an opposite direction, with the current control circuit including multiple current source outputs which are sequentially connected to a first terminal of the load impedance in response to the first sequence of multiple delayed outputs and which are sequentially disconnected from the first terminal in response to the second sequence of multiple delayed outputs.

36. The signal shaping circuit of claim 35 wherein the current control circuit includes a first multiplicity of transistor switches, each having a first terminal connected to a separate one of the current source outputs and a second terminal connected to the first terminal of the load impedance and a control terminal connected to receive one of the multiple delayed outputs of the first sequence and one of the multiple delayed outputs of the second sequence.

37. The signal shaping circuit of claim 36 wherein the transistor switches each include a P-type transistor having a source connected to the first terminal of the load impedance, a drain connected to one of the current source outputs and a gate connected so that the transistor is turned on by the delayed output of the first sequence and turned off by the delayed output of the second sequence.

38. The signal shaping circuit of claim 36 which further produces a second output signal across the impedance having controllable rise and fall transition times from a second input pulse signal shifted in time from the first input pulse signal, with said signal shaping circuit comprising a second delay circuit configured to produce a third sequence of multiple delayed outputs in response to a transition of the second input pulse signal in one direction and to produce a fourth sequence of multiple delayed outputs in response to a transition of the second input pulse signal in an opposite direction and wherein the current control circuitry is further configured to incrementally increase current flow through the impedance in a direction opposite the one direction in response to the third sequence of multiple delayed outputs so as to control a transition time of the second output signal in one direction and to incrementally decrease current flow through the impedance in the direction opposite the one direction so as to control a transition time of the second output signal in an opposite direction.

39. The signal shaping circuit of claim 38 wherein the current control circuitry is further configured to sequentially connect a second terminal of the load impedance to the multiple current source outputs in response to the third sequence of multiple delayed outputs and to sequentially disconnect the second terminal from the multiple current source outputs in response to the fourth sequence of multiple delayed outputs.

40. The signal shaping circuit of claim 39 wherein the current control circuit includes a second multiplicity of transistors switches, each having a first terminal connected to one of the current source outputs and a second terminal connected to the second terminal of the load impedance and a control terminal connected to receive one of the multiple delayed outputs of the third sequence and one of the multiple delayed outputs of the fourth sequence.

41. The signal shaping circuit of claim 40 wherein the second multiplicity of transistor switches each include a P-type transistor having a source connected to the second terminal of the load impedance, a drain connected to one of the current source outputs and a gate connected so that the transistor is turned on by the delayed output of the third sequence and turned off by the delayed output of the fourth sequence.

42. A method of producing a first output signal having controllable rise and fall transition times from a first input pulse signal and a second output signal having controllable rise and fall transition times, with the second input pulse being translated in time from the first input pulse, said method comprising:

generating a first sequence of multiple delayed outputs in response to a transition of the first input pulse signal in one direction;

generating a second sequence of multiple delayed outputs in response to a transition of the first input pulse signal in an opposite direction;

producing a transition in the first output signal in one direction having a transition time controlled by the first sequence of multiple delayed outputs;

producing a transition in the first output signal in an opposite direction having a transition time controlled by the second sequence of multiple delayed outputs;

generating a third sequence of multiple delayed outputs in response to a transition of the second input pulse signal in one direction;

generating a fourth sequence of multiple delayed outputs in response to a transition of the second input pulse signal in an opposite direction;

producing a transition in the second output signal in one direction having a transition time controlled by the third sequence of multiple delayed outputs; and producing a transition in the second output signal in an opposite direction having a transition time controlled by the fourth sequence of multiple delayed outputs.

43. The method of claim 42 wherein the producing a transition time in the first output signal in one direction includes incrementally increasing current flow in an output impedance in a first direction in response to the first sequence of multiple delayed outputs, the producing a transition time in the first output signal in an opposite direction includes incrementally decreasing current flow in the output impedance in the first direction in response to the second sequence of multiple delayed outputs, the producing a transition time in the second output signal in one direction includes incrementally increasing current flow in the output impedance in the opposite direction in response to the third sequence of multiple delayed outputs, and the producing a transition time in the second output signal in an opposite direction includes incrementally decreasing current flow in the output impedance in the opposite direction in response to the fourth sequence of multiple delayed outputs.

44. A signal shaping circuit for producing a first output signal having controllable rise and fall transition times from a first input pulse signal and a second output signal having controllable rise and fall transition times and a polarity opposite the first output signal from a second input pulse signal, with the second input pulse signal being separated in time from the first input pulse signal, said signal shaping circuit comprising:

a first delay circuit configured to produce a first sequence of multiple delayed outputs in response to a transition of the first input pulse signal in one direction and to produce a second sequence of multiple delayed outputs in response to a transition of the first input pulse signal in an opposite direction;

first transition control circuitry configured to control a transition time of the first output signal in one direction in response to the first sequence of multiple delayed outputs and to control a transition time of the first output signal in an opposite direction in response to the second sequence of multiple delayed outputs;

a second delay circuit configured to produce a third sequence of multiple delayed outputs in response to a transition of the second input pulse signal in one direction and to produce a fourth sequence of multiple delayed outputs in response to a transition of the second input pulse signal in an opposite direction; and second transition control circuitry configured to control a transition time of the second output signal in one direction in response to the third sequence of multiple delayed outputs and to control the transition time of the second output signal in an opposite direction in response to the fourth sequence of multiple delayed outputs.

* * * * *